(12) United States Patent
Seki et al.

(10) Patent No.: US 12,477,733 B2
(45) Date of Patent: Nov. 18, 2025

(54) SEMICONDUCTOR MEMORY DEVICE

(71) Applicant: Kioxia Corporation, Tokyo (JP)

(72) Inventors: Harumi Seki, Kawasaki (JP);
Masamichi Suzuki, Koto (JP); Reika Tanaka, Yokohama (JP); Kensuke Ota, Yokohama (JP); Yusuke Higashi, Zushi (JP)

(73) Assignee: Kioxia Corporation, Tokyo (JP)

( * ) Notice: Subject to any disclaimer, the term of this patent is extended or adjusted under 35 U.S.C. 154(b) by 615 days.

(21) Appl. No.: 17/929,454

(22) Filed: Sep. 2, 2022

(65) Prior Publication Data

US 2023/0320093 A1 Oct. 5, 2023

(30) Foreign Application Priority Data

Mar. 16, 2022 (JP) ................................ 2022-041800

(51) Int. Cl.
*H10B 43/27* (2023.01)
*H10D 64/68* (2025.01)

(52) U.S. Cl.
CPC ........... *H10B 43/27* (2023.02); *H10D 64/689* (2025.01)

(58) Field of Classification Search
CPC ........ H10B 43/27; H10B 43/10; H10B 51/10; H10B 51/20; H10D 64/689
See application file for complete search history.

(56) References Cited

U.S. PATENT DOCUMENTS

| 8,247,857 B2 | 8/2012 | Ozawa et al. |
| 8,796,757 B2 | 8/2014 | Kai et al. |
| 11,417,674 B2 * | 8/2022 | Seki ....................... H10B 43/20 |

(Continued)

FOREIGN PATENT DOCUMENTS

| JP | 2011-146631 A | 7/2011 |
| JP | 2019-169573 A | 10/2019 |

(Continued)

OTHER PUBLICATIONS

Cheng, et al., "Investigation of Re-program Scheme in Charge Trap Based 3D NAND Flash Memory", IEEE Journal of the Electron Devices Society, 2021, 5 Pages.

*Primary Examiner* — Julia Slutsker
(74) *Attorney, Agent, or Firm* — Oblon, McClelland, Maier & Neustadt, L.L.P.

(57) ABSTRACT

A semiconductor memory device according to an embodiment includes a stacked body in which a gate electrode layer and a first insulating layer are alternately stacked in a first direction, a semiconductor layer in the stacked body and extending in the first direction, a second insulating layer between the semiconductor layer and the stacked body, a third insulating layer provided between the second insulating layer and the stacked body, and a first layer between the second insulating layer and the third insulating layer. The first layer contains silicon and nitrogen and includes a first region between the gate electrode layer and the semiconductor layer and a second region between the first insulating layer and the semiconductor layer, the first region contains or does not contain fluorine, the second region contains fluorine, and a fluorine concentration of the second region is higher than a fluorine concentration of the first region.

18 Claims, 17 Drawing Sheets

(56) References Cited

U.S. PATENT DOCUMENTS

| | | |
|---|---|---|
| 11,737,281 B2 * | 8/2023 | Seki ................. H10B 43/20 257/295 |
| 2011/0175157 A1 | 7/2011 | Sekine et al. |
| 2019/0296234 A1 | 9/2019 | Yoshimura et al. |
| 2019/0304988 A1 | 10/2019 | Dong et al. |
| 2019/0311756 A1 | 10/2019 | Sharma et al. |
| 2020/0357822 A1 * | 11/2020 | Chen ................. G11C 11/223 |
| 2021/0083064 A1 | 3/2021 | Okada et al. |
| 2021/0249420 A1 * | 8/2021 | Seki ................. H10D 64/037 |
| 2022/0328516 A1 * | 10/2022 | Yamazaki ........... H10B 43/40 |
| 2022/0406796 A1 | 12/2022 | Seki et al. |

FOREIGN PATENT DOCUMENTS

| | | |
|---|---|---|
| JP | 2021-125594 A | 8/2021 |
| JP | 2023-1408 A | 1/2023 |

* cited by examiner

SEMICONDUCTOR MEMORY DEVICE

CROSS-REFERENCE TO RELATED APPLICATION

This application is based upon and claims the benefit of priority from Japanese Patent Application No. 2022-041800, filed on Mar. 16, 2022, the entire contents of which are incorporated herein by reference.

FIELD

Embodiments described herein relate generally to a semiconductor memory device.

BACKGROUND

A three-dimensional NAND flash memory in which memory cells are three-dimensionally arranged realizes a high degree of integration and low cost. In the three-dimensional NAND flash memory, for example, a memory hole penetrating a stacked body is formed in the stacked body in which a plurality of insulating layers and a plurality of gate electrode layers are alternately stacked. A memory string in which a plurality of memory cells are connected in series is formed by forming a charge storage layer and a semiconductor layer in the memory hole. Data is stored in the memory cell by controlling the amount of charges retained in the charge storage layer.

DETAILED DESCRIPTION

Figure 1:
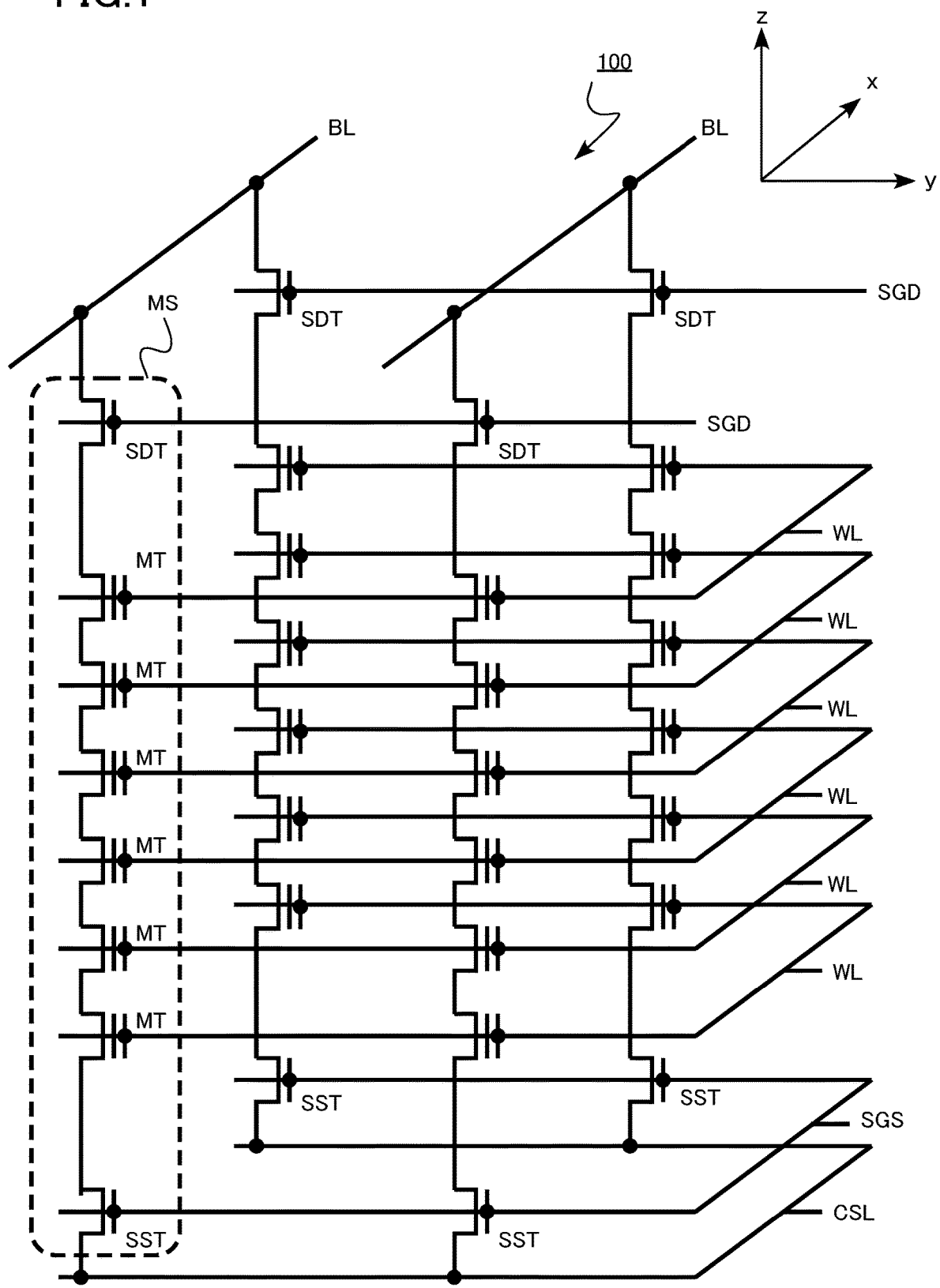
FIG. 1 is a circuit diagram of a memory cell array of a semiconductor memory device according to a first embodiment.

A semiconductor memory device according to an embodiment includes a stacked body in which a gate electrode layer and a first insulating layer are alternately stacked in a first direction; a semiconductor layer provided in the stacked body and extending in the first direction; a second insulating layer provided between the semiconductor layer and the stacked body; a third insulating layer provided between the second insulating layer and the stacked body; and a first layer provided between the second insulating layer and the third insulating layer, the first layer containing silicon (Si) and nitrogen (N), the first layer including a first region between the gate electrode layer and the semiconductor layer and a second region between the first insulating layer and the semiconductor layer, the first region containing or not containing fluorine (F), the second region containing fluorine (F), and a fluorine concentration of the second region being higher than a fluorine concentration of the first region.

Hereinafter, embodiments of the present disclosure will be described with reference to the drawings. In the following description, the same or similar members will be denoted by the same reference numerals, and the description of the members once described will be appropriately omitted.

In the present specification, the term "upper" or "lower" may be used for the sake of convenience. The term "upper" or "lower" is, for example, a term indicating a relative positional relationship in the drawings. The term "upper" or "lower" is not a term that necessarily defines a positional relationship with respect to gravity.

Qualitative analysis and quantitative analysis of a chemical composition of members constituting a semiconductor memory device in the present specification can be performed by, for example, secondary ion mass spectroscopy (SIMS), energy dispersive X-ray spectroscopy (EDX), or electron energy loss spectroscopy (EELS). For example, a transmission electron microscope (TEM) can be used to measure thicknesses of the members constituting the semiconductor memory device, a distance between the members, and the like. For identification of a crystal system of a constituent substance of the member constituting the semiconductor memory device and comparison in magnitude of an abundance of the crystal system, it is possible to use, for example, a transmission electron microscope, X-ray diffraction (XRD), electron beam diffraction (EBD), X-ray photoelectron spectroscopy (XPS), or synchrotron radiation X-ray absorption fine structure (XAFS).

In the present specification, the "ferroelectric substance" means a substance that has spontaneous polarization without applying an electric field from the outside and means a substance in which polarization is reversed when an electric field is applied from the outside. In the present specification, the term "paraelectric substance" means a substance in which polarization occurs when an electric field is applied and means a substance in which polarization disappears when an electric field is removed.

First Embodiment

A semiconductor memory device according to a first embodiment includes a stacked body in which a gate electrode layer and a first insulating layer are alternately stacked in a first direction, a semiconductor layer provided in the stacked body and extending in the first direction, a second insulating layer provided between the semiconductor layer and the stacked body, a third insulating layer provided between the second insulating layer and the stacked body, and a first layer provided between the second insulating layer and the third insulating layer. The first layer contains silicon (Si) and nitrogen (N) and includes a first region between the gate electrode layer and the semiconductor layer and a second region between the first insulating layer and the semiconductor layer, the first region contains or does not contain fluorine (F), the second region contains fluorine (F), and a fluorine concentration of the second region is higher than a fluorine concentration of the first region.

The semiconductor memory device according to the first embodiment is a three-dimensional NAND flash memory. The memory cell of the semiconductor memory device according to the first embodiment is a so-called Metal-Oxide-Nitride-Oxide-Semiconductor type (MONOS type) memory cell.

FIG. 1 is a circuit diagram of a memory cell array of the semiconductor memory device according to the first embodiment.

As illustrated in FIG. 1, a memory cell array 100 of the three-dimensional NAND flash memory according to the first embodiment includes a plurality of word lines WL, a common source line CSL, a source selection gate line SGS, a plurality of drain selection gate lines SGD, a plurality of bit lines BL, and a plurality of memory strings MS.

The plurality of word lines WL are arranged in a z direction while being separated from each other. The plurality of word lines WL are stacked and arranged in the z direction. The plurality of memory strings MS extend in the z direction. The plurality of bit lines BL extend in, for example, an x direction.

Hereinafter, the x direction is defined as a second direction, a y direction is defined as a third direction, and the z direction is defined as a first direction. The x direction, the y direction, and the z direction cross each other, and are, for example, perpendicular to each other.

As illustrated in FIG. 1, the memory string MS includes a source selection transistor SST, a plurality of memory cells, and a drain selection transistor SDT connected in series between the common source line CSL and the bit line BL. One memory string MS is selected by selecting one bit line BL and one drain selection gate line SGD, and one memory cell can be selected by selecting one word line WL. The word line WL is a gate electrode of a memory cell transistor MT constituting the memory cell.

Figure 2A:
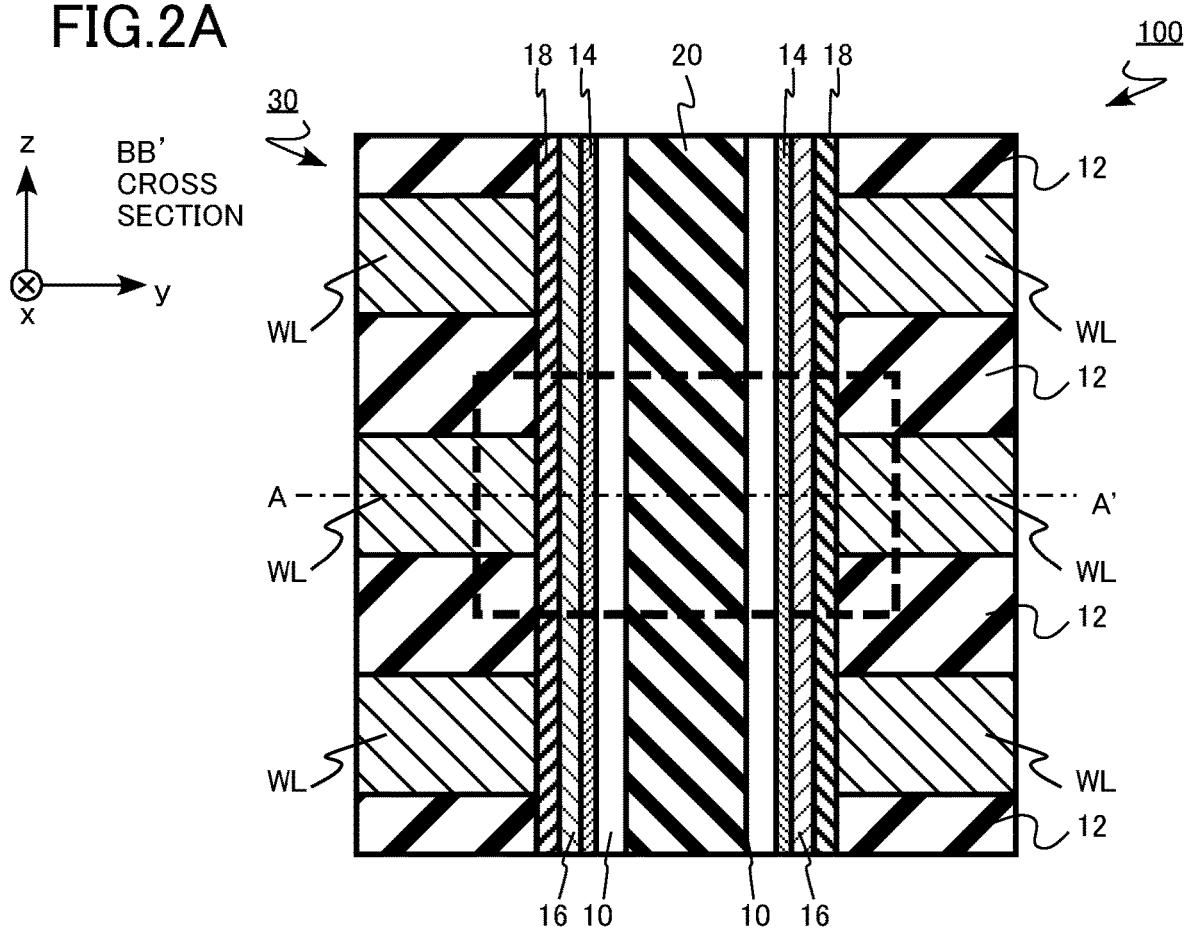
FIGS. 2A and 2B are schematic cross-sectional views of the memory cell array of the semiconductor memory device according to the first embodiment.
Figure 2B:
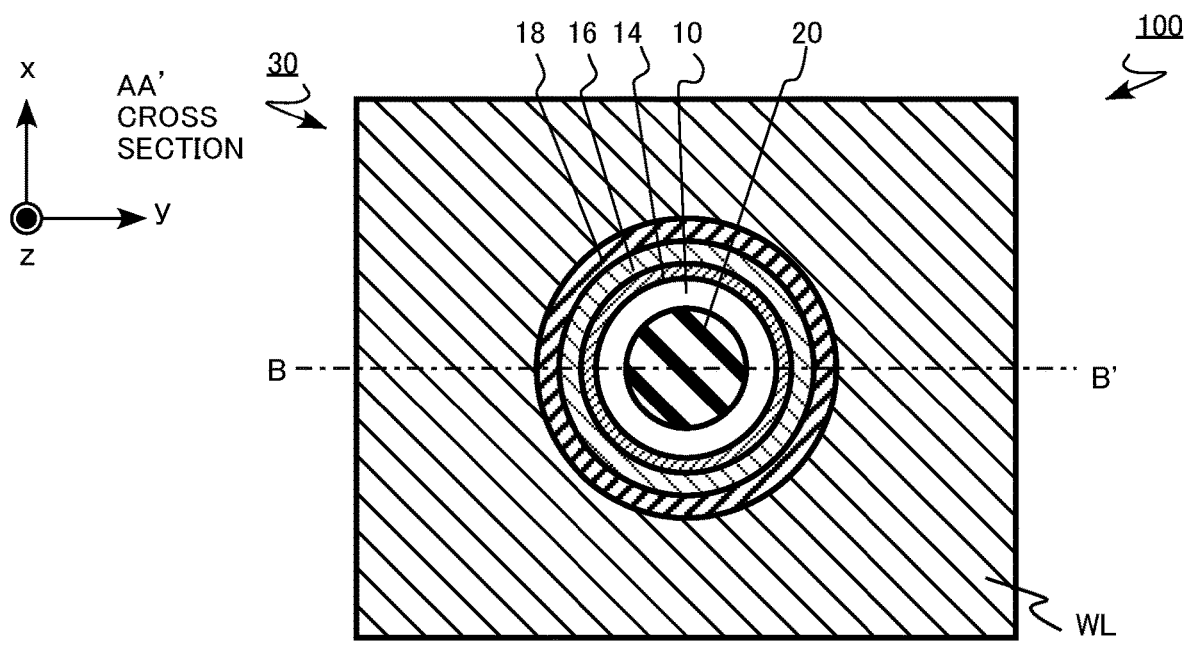

FIGS. 2A and 2B are schematic cross-sectional views of the memory cell array of the semiconductor memory device according to the first embodiment. FIGS. 2A and 2B illustrate cross sections of the plurality of memory cells in one memory string MS surrounded by a dotted line, for example, in the memory cell array 100 of FIG. 1.

FIG. 2A is an yz cross-sectional view of the memory cell array 100. FIG. 2A is a BB' cross section of FIG. 2B. FIG. 2B is an xy cross-sectional view of the memory cell array 100. FIG. 2B is an AA' cross section of FIG. 2A. In FIG. 2A, a region surrounded by a broken line is one memory cell.

Figure 3:
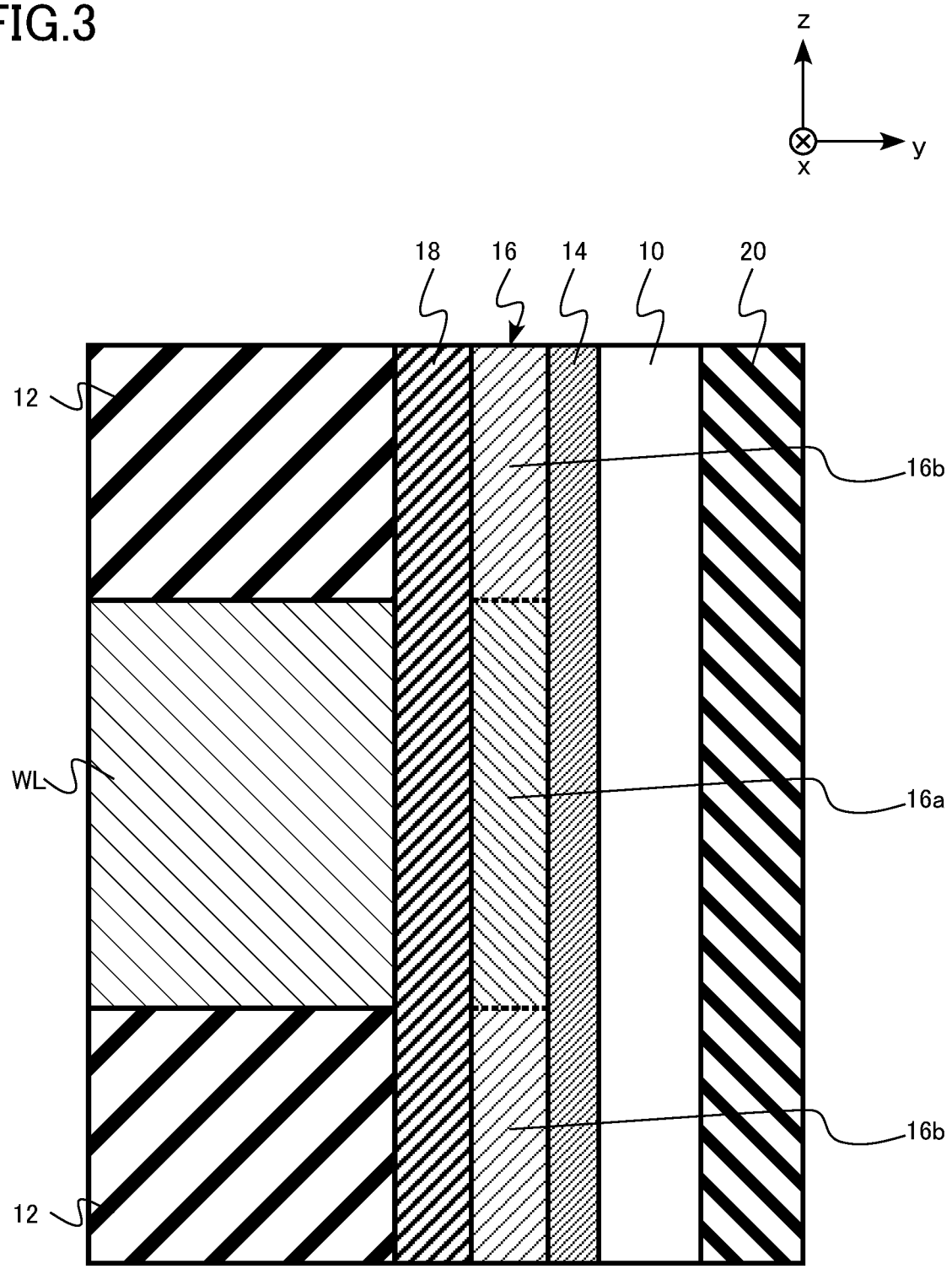
FIG. 3 is a schematic cross-sectional view of a memory cell of the semiconductor memory device according to the first embodiment.

FIG. 3 is a schematic cross-sectional view of the memory cell of the semiconductor memory device according to the first embodiment. FIG. 3 is an enlarged cross-sectional view of a part of the memory cell.

As illustrated in FIGS. 2A, 2B, and 3, the memory cell array 100 includes word lines WL, semiconductor layers 10, interlayer insulating layers 12, tunnel insulating layers 14, charge storage layers 16, first block insulating layers 18, and a core insulating region 20.

The plurality of word lines WL and the plurality of interlayer insulating layers 12 constitute a stacked body 30. The charge storage layer 16 includes a charge storage region 16a and an inter-cell region 16b.

The word line WL is an example of a gate electrode layer. The interlayer insulating layer 12 is an example of a first insulating layer. The tunnel insulating layer 14 is an example of a second insulating layer. The first block insulating layer 18 is an example of a third insulating layer. The charge storage layer 16 is an example of a first layer. The charge storage region 16a is an example of a first region. The inter-cell region 16b is an example of a second region.

The memory cell array 100 is provided, for example, on a semiconductor substrate (not illustrated). The semiconductor substrate has a surface parallel to the x direction and the y direction.

The word lines WL and the interlayer insulating layers 12 are alternately stacked in the z direction on the semiconductor substrate. The word lines WL are repeatedly arranged in the z direction while being separated from each other. The plurality of word lines WL and the plurality of interlayer insulating layers 12 constitute a stacked body 30. The word line WL functions as a control electrode of the memory cell transistor MT.

The word line WL is a plate-like conductor. The word line WL is, for example, a metal, a metal nitride, a metal carbide, or a semiconductor. The word line WL is, for example, tungsten (W). A thickness of the word line WL in the z direction is, for example, equal to or more than 5 nm and equal to or less than 20 nm.

The interlayer insulating layer 12 isolates the word line WL from the word line WL. The interlayer insulating layer 12 electrically isolates the word line WL from the word line WL.

The interlayer insulating layer 12 is, for example, an oxide, an oxynitride, or a nitride. The interlayer insulating layer 12 contains, for example, silicon (Si) and oxygen (O). The interlayer insulating layer 12 is, for example, a silicon oxide. A thickness of the interlayer insulating layer 12 in the z direction is, for example, equal to or more than 5 nm and equal to or less than 20 nm.

The interlayer insulating layer 12 contains, for example, fluorine (F). A fluorine concentration of the interlayer insulating layer 12 is, for example, equal to or more than $1\times10^{19}$ atoms/cm$^3$ and equal to or less than $1\times10^{22}$ atoms/cm$_3$.

The semiconductor layer 10 is provided in the stacked body 30. The semiconductor layer 10 extends in the z direction. The semiconductor layer 10 extends in a direction perpendicular to a surface of the semiconductor substrate.

The semiconductor layer 10 is provided to penetrate the stacked body 30. The semiconductor layer 10 is surrounded by the plurality of word lines WL. The semiconductor layer 10 has, for example, a cylindrical shape. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating layer 14 is provided between the semiconductor layer 10 and the stacked body 30. The tunnel insulating layer 14 is provided between the semiconductor layer 10 and the word line WL. The tunnel insulating layer 14 is provided between the semiconductor layer 10 and at least one of the plurality of word lines WL. The tunnel insulating layer 14 is provided between the semiconductor layer 10 and the charge storage layer 16. The tunnel insulating layer 14 is also provided between the semiconductor layer 10 and the interlayer insulating layer 12. The tunnel insulating layer 14 has a function of causing charges to pass in accordance with a voltage applied between the word line WL and the semiconductor layer 10.

The tunnel insulating layer 14 contains, for example, silicon (Si), nitrogen (N), and oxygen (O). The tunnel insulating layer 14 includes, for example, a silicon nitride or a silicon oxynitride. A thickness of the tunnel insulating layer 14 is, for example, equal to or more than 3 nm and equal to or less than 8 nm.

The tunnel insulating layer 14 includes, for example, a lower layer portion, an intermediate portion, and an upper layer portion. The lower layer portion is provided between the semiconductor layer 10 and the intermediate portion. The intermediate portion is provided between the lower layer portion and the upper layer portion. The upper layer portion is provided between the intermediate portion and the charge storage layer 16.

The lower layer portion is, for example, a silicon oxide. The intermediate portion is, for example, a silicon nitride or a silicon oxynitride. The upper layer portion is, for example, a silicon oxide.

The charge storage layer 16 is provided between the tunnel insulating layer 14 and the first block insulating layer 18.

The charge storage layer 16 has a function of trapping and storing charges. The charge is, for example, an electron. A threshold voltage of the memory cell transistor MT changes in accordance with the amount of charges stored in the charge storage layer 16. One memory cell can store data by using this change in the threshold voltage.

For example, the threshold voltage of the memory cell transistor MT changes, and thus, a voltage at which the memory cell transistor MT is turned on changes. For example, when a state where the threshold voltage is high is defined as data "0" and a state where the threshold voltage is low is defined as data "1", the memory cell can store one-bit data of "0" and "1".

The charge storage layer 16 contains silicon (Si) and nitrogen (N). The charge storage layer 16 contains, for example, a silicon nitride. The charge storage layer 16 is, for example, a silicon nitride. A thickness of the charge storage layer 16 is, for example, equal to or more than 3 nm and equal to or less than 10 nm.

As illustrated in FIG. 3, the charge storage layer 16 includes a charge storage region 16a and an inter-cell region 16b. The charge storage region 16a is provided between the word line WL and the semiconductor layer 10. The inter-cell region 16b is provided between the interlayer insulating layer 12 and the semiconductor layer 10.

The charge storage region 16a contains silicon (Si) and nitrogen (N). The charge storage region 16a contains or does not contain fluorine (F). The inter-cell region 16b contains silicon (Si), nitrogen (N), and fluorine (F). A fluorine concentration of the inter-cell region 16b is higher than the fluorine concentration of the charge storage region 16a.

The fluorine concentration of the inter-cell region 16b is, for example, equal to or more than $1 \times 10^{19}$ atoms/cm$^3$ and equal to or less than $1 \times 10^{20}$ atoms/cm$^3$. The fluorine concentration of the charge storage region 16a is, for example, less than $1 \times 10^{19}$ atoms/cm$_3$.

An atomic ratio of nitrogen (N) to silicon (Si) in the charge storage layer 16 is, for example, equal to or more than 1.2.

An atomic ratio (N/Si) of nitrogen (N) to silicon (Si) in the charge storage region 16a is larger than an atomic ratio (N/Si) of nitrogen (N) to silicon (Si) in the inter-cell region 16b.

The atomic ratio (N/Si) of nitrogen (N) to silicon (Si) in the charge storage region 16a is, for example, equal to or more than 1.25 and equal to or less than 1.4.

The atomic ratio (N/Si) of nitrogen (N) to silicon (Si) in the inter-cell region 16b is, for example, equal to or more than 1.2 and less than 1.25.

In a case where the silicon nitride has a stoichiometric composition (stoichiometry), that is, in a case where the silicon nitride has a composition of $Si_3N_4$, an atomic ratio (N/Si) of nitrogen (N) to silicon (Si) is about 1.33.

For example, fluorine is thermally diffused from the interlayer insulating layer 12 containing fluorine, and thus, the fluorine concentration of the inter-cell region 16b can be set to be higher than the fluorine concentration of the charge storage region 16a.

The first block insulating layer 18 is provided between the tunnel insulating layer 14 and the word line WL. The first block insulating layer 18 is provided between the charge storage layer 16 and the word line WL. The first block insulating layer 18 is also provided between the semiconductor layer 10 and the interlayer insulating layer 12. The first block insulating layer 18 has a function of blocking a current flowing between the charge storage layer 16 and the word line WL.

The first block insulating layer 18 is, for example, an oxide, an oxynitride, or a nitride. The first block insulating layer 18 contains, for example, silicon (Si) and oxygen (O). The first block insulating layer 18 is, for example, a silicon oxide. A thickness of the first block insulating layer 18 is, for example, equal to or more than 3 nm and equal to or less than 10 nm.

The core insulating region 20 is provided in the stacked body 30. The core insulating region 20 extends in the z direction. The core insulating region 20 is provided penetrating the stacked body 30. The core insulating region 20 is surrounded by the semiconductor layer 10. The core insulating region 20 is surrounded by the plurality of word lines WL. The core insulating region 20 has a columnar shape. The core insulating region 20 has, for example, a cylindrical shape.

The core insulating region 20 is, for example, an oxide, an oxynitride, or a nitride. The core insulating region 20 contains, for example, silicon (Si) and oxygen (O). The core insulating region 20 is, for example, a silicon oxide.

Next, functions and effects of the semiconductor memory device according to the first embodiment will be described.

In the three-dimensional NAND flash memory according to the first embodiment, the fluorine concentration of the inter-cell region 16b of the charge storage layer 16 is set to be higher than the fluorine concentration of the charge storage region 16a, and thus, charge retention characteristics are improved. In the three-dimensional NAND flash memory according to the first embodiment, threshold voltage fluctuation of the memory cell transistor MT is suppressed.

Figure 4:
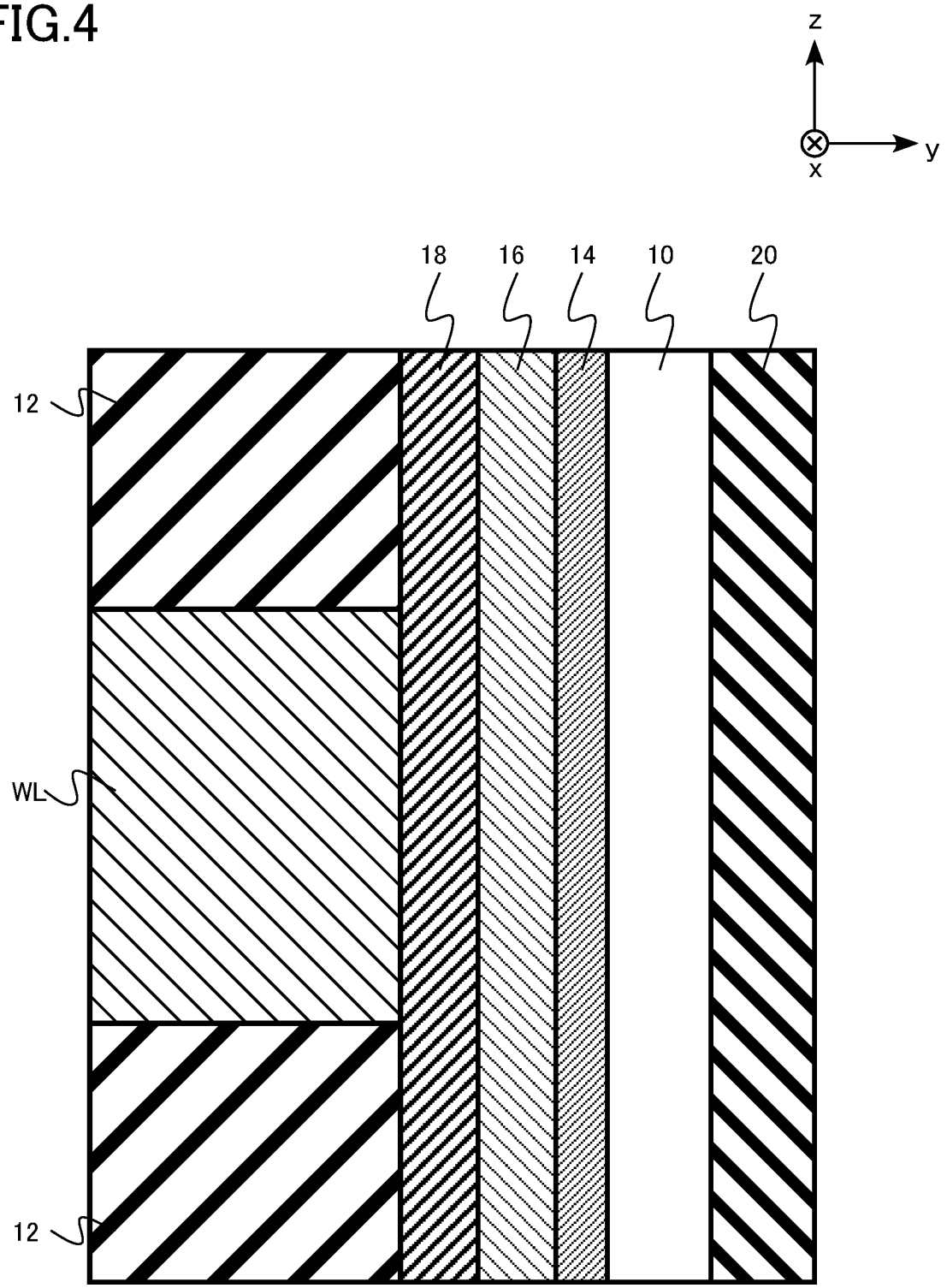
FIG. 4 is a schematic cross-sectional view of a memory cell of a semiconductor memory device according to a comparative example.

FIG. 4 is a schematic cross-sectional view of a memory cell of a semiconductor memory device according to a comparative example. The semiconductor memory device according to the comparative example is different from the semiconductor memory device according to the first embodiment illustrated in FIG. 3 in that the charge storage layer 16 does not include the inter-cell region 16b having a high fluorine concentration.

Figure 5:
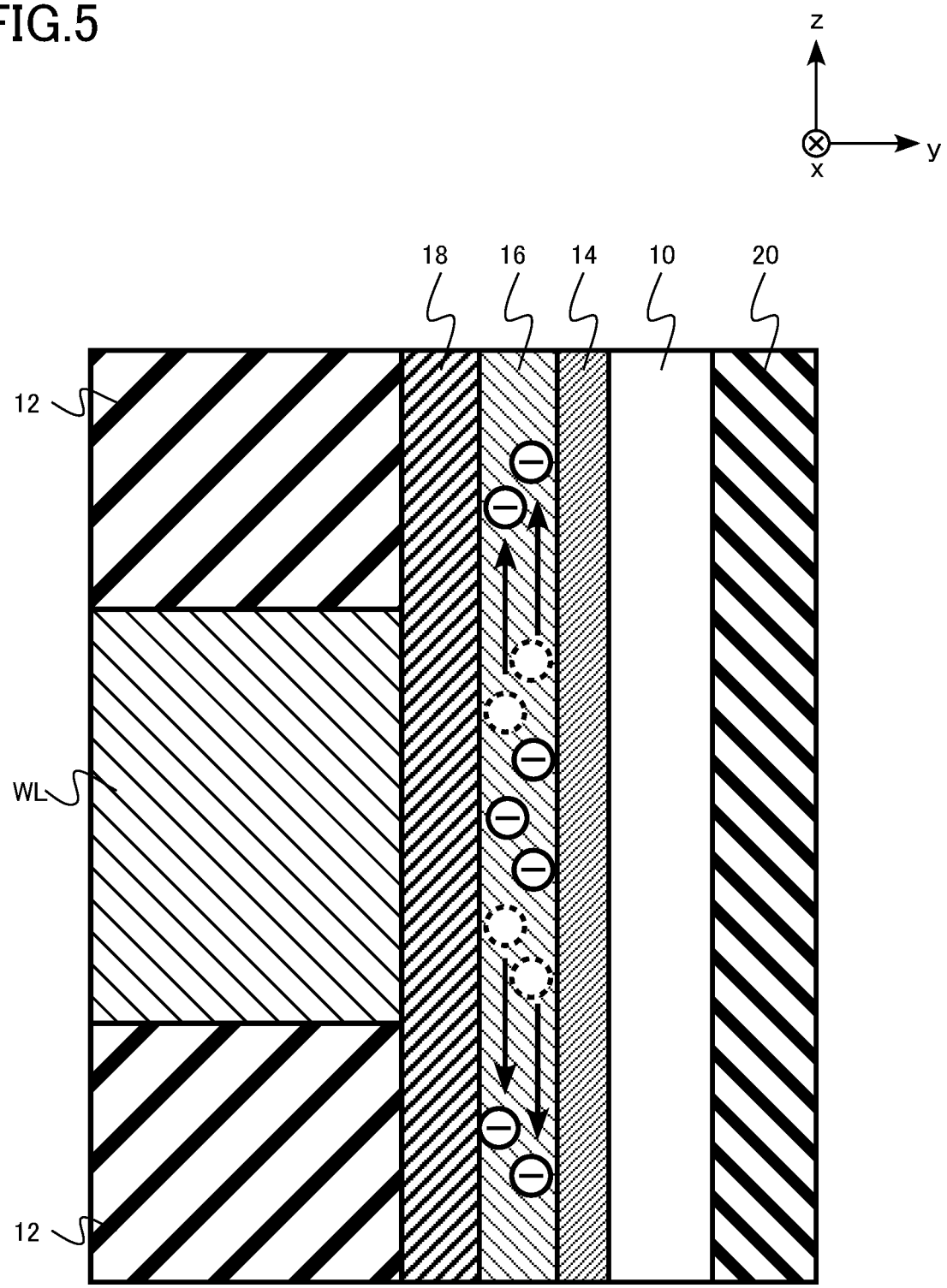
FIG. 5 is an explanatory diagram of a problem of the semiconductor memory device according to the comparative example.

FIG. 5 is an explanatory diagram of a problem of the semiconductor memory device according to the comparative example. FIG. 5 illustrates a state where electrons are written into the charge storage layer 16.

As illustrated in FIG. 5, when a time elapses after the electrons are written into the charge storage layer 16, electron detrapping occurs. The electrons written into the charge storage layer 16 escape in a lateral direction along the charge storage layer 16. So-called lateral migration of the electrons occurs.

When the lateral migration of the electrons occurs, the threshold voltage of the memory cell transistor MT fluctuates. In other words, when the lateral migration of the electrons occurs, the charge retention characteristics of the three-dimensional NAND flash memory degrade.

It is considered that the migration of the electrons is caused by a trap level present in the charge storage layer 16. It is considered that the electrons written into the charge storage layer 16 move in the lateral direction along the charge storage layer 16 via the trap level.

When the silicon nitride contains fluorine, a trap density in the silicon nitride is reduced. The charge storage layer 16 of the three-dimensional NAND flash memory according to the first embodiment includes the inter-cell region 16b having the fluorine concentration higher than the fluorine concentration of the charge storage region 16a. The fluorine concentration of the inter-cell region 16b is high, and thus, the trap density in the inter-cell region 16b is reduced. Accordingly, the lateral migration of the electrons is suppressed. Thus, the fluctuation in the threshold voltage of the memory cell transistor MT is suppressed. In other words, the charge retention characteristics of the three-dimensional NAND flash memory are improved.

The fluorine concentration of the inter-cell region 16b is preferably equal to or more than $1 \times 10^{19}$ atoms/cm$^3$ and equal to or less than $1 \times 10^{20}$ atoms/cm$^3$. When the fluorine concentration exceeds $1 \times 10^{20}$ atoms/cm$^3$, the trap density starts to increase. The fluorine concentration satisfies the above condition, and thus, a low trap level density can be realized. When the fluorine concentration exceeds $1 \times 10^{20}$ atoms/cm$^3$, a depth of the trap level becomes shallow. Accordingly, electrons are not trapped in the trap level, and there is a possibility that the lateral migration is promoted.

The fluorine concentration of the charge storage region 16a is preferably less than $1 \times 10^{19}$ atoms/cm$^3$. When the fluorine concentration of the charge storage region 16a is equal to or more than $1 \times 10^{19}$ atoms/cm$^3$, the trap density of the charge storage region 16a decreases, and the amount of charges that can be written into the memory cell decreases.

The atomic ratio of nitrogen (N) to silicon (Si) in the charge storage layer 16 is preferably, for example, equal to or more than 1.2.

The diffusion of the fluorine in the silicon nitride depends on the atomic ratio (N/Si) of nitrogen (N) to silicon (Si). When the atomic ratio of nitrogen (N) to silicon (Si) is less than 1.2, the diffusion of the fluorine in the silicon nitride increases. Accordingly, for example, the fluorine in the inter-cell region 16b may diffuse into the charge storage region 16a, and there is a concern that the trap density of the charge storage region 16a decreases.

The atomic ratio (N/Si) of nitrogen (N) to silicon (Si) in the charge storage region 16a is preferably larger than the atomic ratio (N/Si) of nitrogen (N) to silicon (Si) in the inter-cell region 16b. The diffusion of the fluorine in the inter-cell region 16b into the charge storage region 16a can be suppressed by increasing the atomic ratio (N/Si) of nitrogen (N) to silicon (Si) in the charge storage region 16a.

The atomic ratio (N/Si) of nitrogen (N) to silicon (Si) in the charge storage region 16a is preferably equal to or more than 1.25. The diffusion of the fluorine in the inter-cell region 16b into the charge storage region 16a can be suppressed by setting the atomic ratio (N/Si) of nitrogen (N) to silicon (Si) in the charge storage region 16a to be equal to or more than 1.25. A shallow trap level in the charge storage region 16a is reduced by setting the atomic ratio (N/Si) of nitrogen (N) to silicon (Si) in the charge storage region 16a to be equal to or more than 1.25, and electron detrapping is less likely to occur.

The atomic ratio (N/Si) of nitrogen (N) to silicon (Si) in the inter-cell region 16b is preferably equal to or more than 1.2 and less than 1.25. The atomic ratio (N/Si) of nitrogen (N) to silicon (Si) is higher than the above lower limit value, and thus, the diffusion of the fluorine in the silicon nitride is moderately suppressed. Accordingly, the fluorine concentration of the inter-cell region 16b is easily controlled. The atomic ratio (N/Si) of nitrogen (N) to silicon (Si) is lower than the above upper limit value, and thus, the diffusion of the fluorine proceeds. Accordingly, it becomes easy to increase the fluorine concentration of the inter-cell region 16b.

As described above, according to the first embodiment, the fluorine concentration of the inter-cell region 16b of the charge storage layer 16 is increased, and thus, it is possible to provide the semiconductor memory device capable of suppressing the lateral migration of the electrons and improving the charge retention characteristics.

Second Embodiment

A semiconductor memory device according to a second embodiment is different from the semiconductor device according to the first embodiment in that the semiconductor memory device further includes a fourth insulating layer provided between the gate electrode layer and the third insulating layer and between the gate electrode layer and the first insulating layer, the fourth insulating layer including a third region between the gate electrode layer and the third insulating layer and a fourth region between the gate electrode layer and the first insulating layer, the third region including or not including fluorine (F), the fourth region including fluorine (F), the fluorine concentration of the fourth region being higher than the fluorine concentration of the third region. Hereinafter, a part of contents overlapping the contents of the first embodiment will not be described.

Figure 6A:
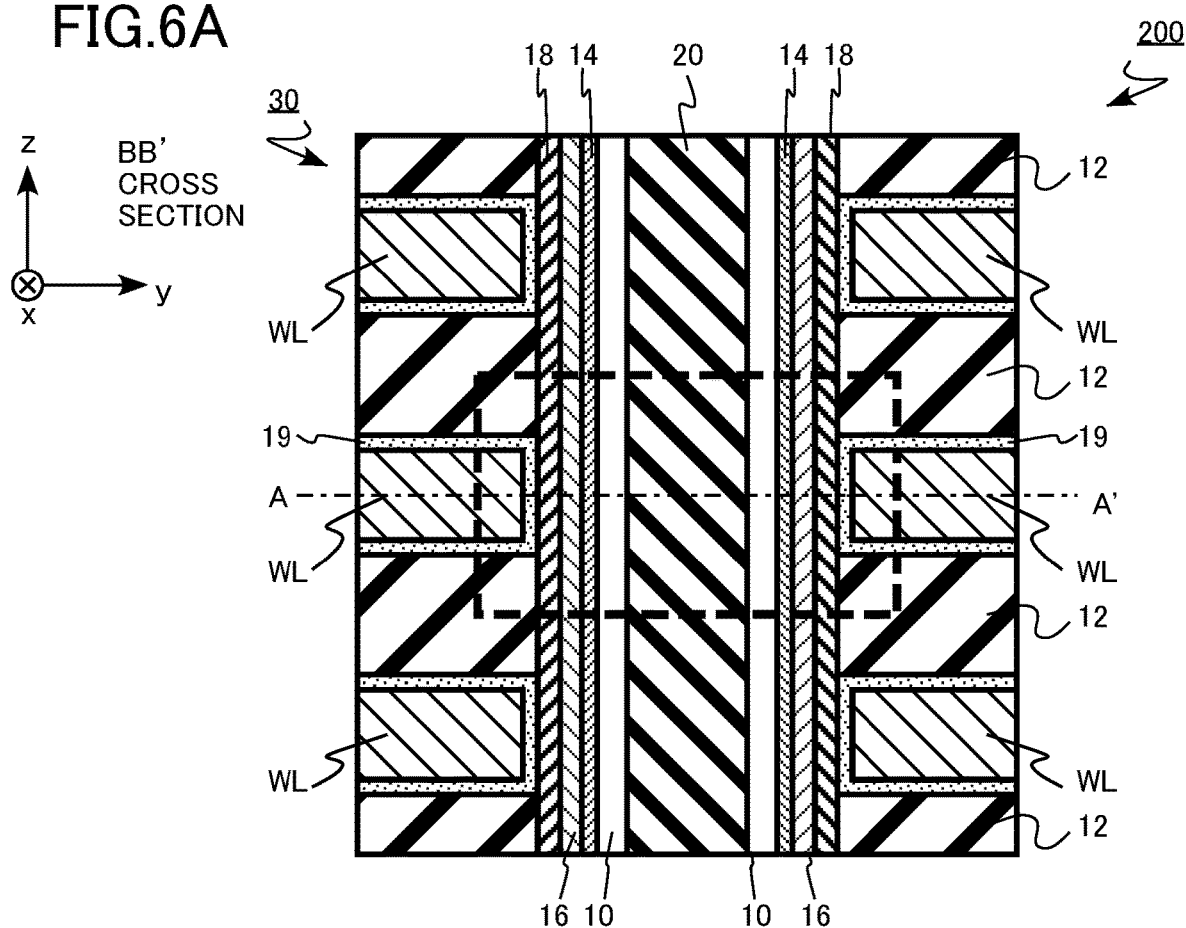
FIGS. 6A and 6B are schematic cross-sectional views of a memory cell array of a semiconductor memory device according to a second embodiment.
Figure 6B:
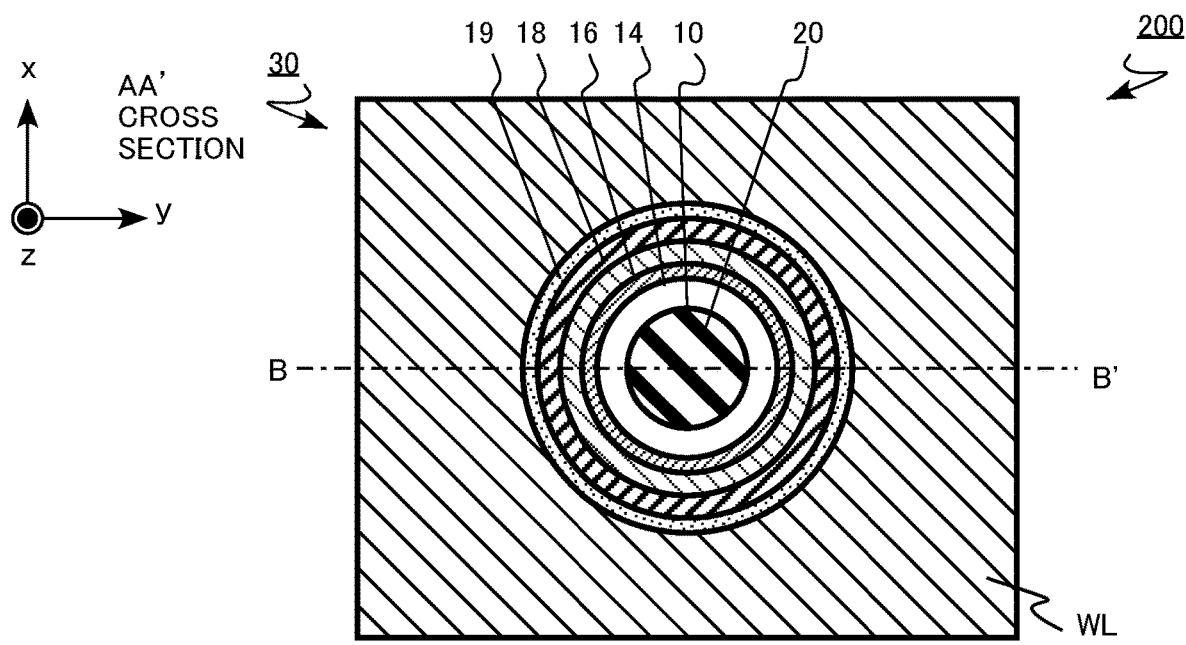

FIGS. 6A and 6B are schematic cross-sectional views of the memory cell array of the semiconductor memory device according to the second embodiment. FIGS. 6A and 6B are diagrams corresponding to FIGS. 2A and 2B of the first embodiment.

FIG. 6A is an yz cross-sectional view of a memory cell array 200. FIG. 6A is a BB' cross section of FIG. 6B. FIG. 6B is an xy cross-sectional view of the memory cell array 200. FIG. 6B is an AA' cross section of FIG. 6A. In FIG. 6A, a region surrounded by a broken line is one memory cell.

Figure 7:
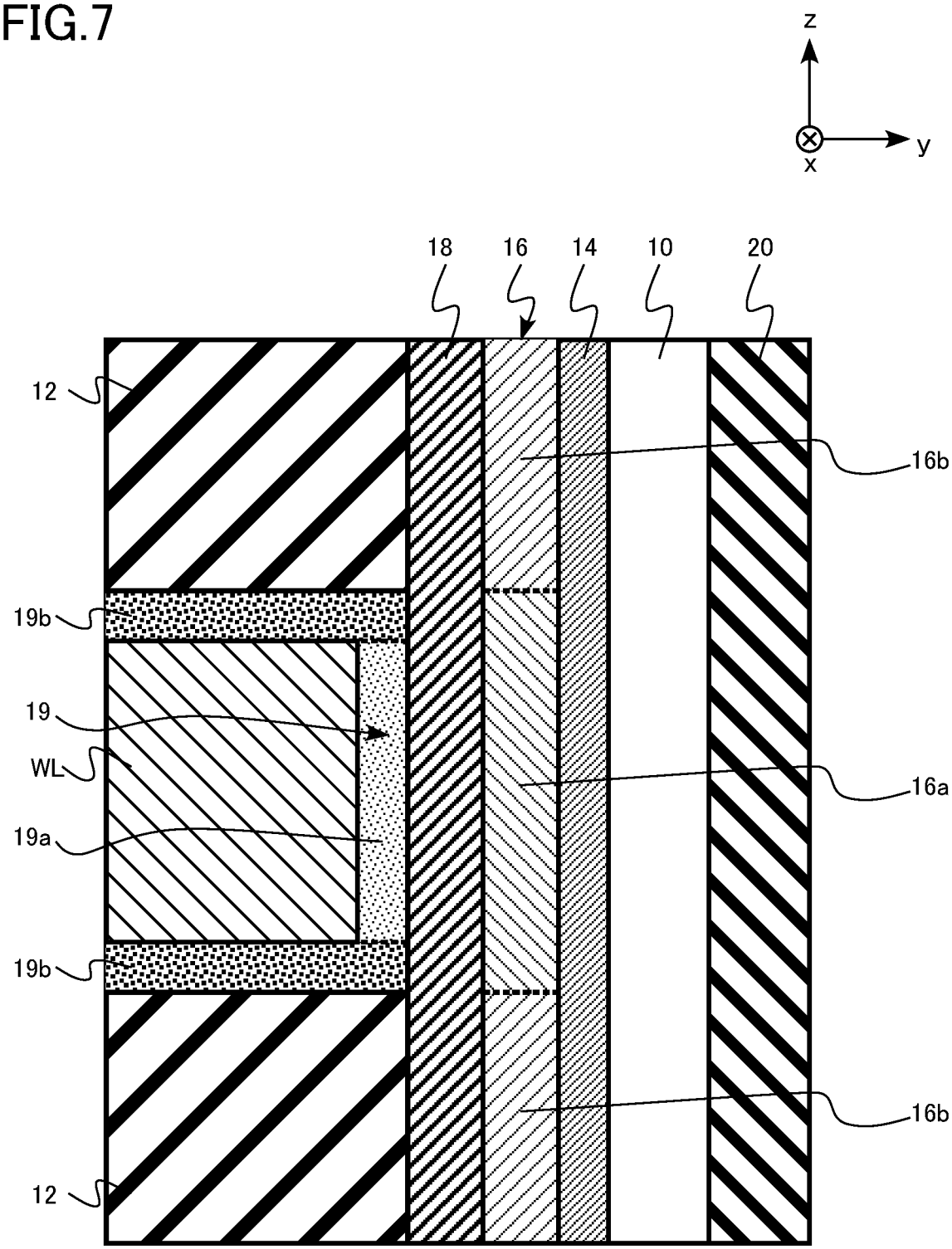
FIG. 7 is a schematic cross-sectional view of a memory cell of the semiconductor memory device according to the second embodiment.

FIG. 7 is a schematic cross-sectional view of the memory cell of the semiconductor memory device according to the second embodiment. FIG. 7 is an enlarged cross-sectional view of a part of the memory cell. FIG. 7 is a diagram corresponding to FIG. 3 of the first embodiment.

As illustrated in FIGS. 6A, 6B, and 7, the memory cell array 200 includes word lines WL, semiconductor layers 10, interlayer insulating layers 12, tunnel insulating layers 14, charge storage layers 16, first block insulating layers 18, second block insulating layers 19, and a core insulating region 20.

The plurality of word lines WL and the plurality of interlayer insulating layers 12 constitute a stacked body 30. The charge storage layer 16 includes a charge storage region 16a and an inter-cell region 16b. The second block insulating layer 19 includes a block region 19a and an interlayer region 19b.

The word line WL is an example of a gate electrode layer. The interlayer insulating layer 12 is an example of a first insulating layer. The tunnel insulating layer 14 is an example of a second insulating layer. The first block insulating layer 18 is an example of a third insulating layer. The charge storage layer 16 is an example of a first layer. The charge storage region 16a is an example of a first region. The inter-cell region 16b is an example of a second region. The second block insulating layer 19 is an example of a fourth insulating layer. The block region 19a is an example of a third region. The interlayer region 19b is an example of a fourth region.

The second block insulating layer 19 is provided between the word line WL and the first block insulating layer 18. The second block insulating layer 19 is provided between the word line WL and the interlayer insulating layer 12. The second block insulating layer 19 has a function of blocking a current flowing between the charge storage layer 16 and the word line WL.

The second block insulating layer 19 is, for example, an oxide, an oxynitride, or a nitride. The second block insulating layer 19 contains, for example, aluminum (Al) and oxygen (O). The second block insulating layer 19 is, for example, an aluminum oxide. A thickness of the second block insulating layer 19 is, for example, equal to or more than 3 nm and equal to or less than 10 nm.

The second block insulating layer 19 is provided, and thus, the charge retention characteristics of the three-dimensional NAND flash memory are further improved as compared with the first embodiment.

As illustrated in FIG. 7, the second block insulating layer 19 includes a block region 19a and an interlayer region 19b. The block region 19a is provided between the word line WL and the first block insulating layer 18. The interlayer region 19b is provided between the word line WL and the interlayer insulating layer 12.

The block region 19a contains aluminum (Al) and oxygen (O). The block region 19a contains or does not contain fluorine (F). The interlayer region 19b contains aluminum (Al), oxygen (O), and fluorine (F). A fluorine concentration of the interlayer region 19b is higher than a fluorine concentration of the block region 19a.

For example, fluorine is thermally diffused from the interlayer insulating layer 12 containing fluorine, and thus, the fluorine concentration of the interlayer region 19b can be set to be higher than the fluorine concentration of the block region 19a.

The fluorine concentration of the interlayer region 19b is high, and thus, a dielectric constant of the interlayer region 19b decreases. Accordingly, the capacity between the word lines WL is reduced. Thus, the power consumption of the three-dimensional NAND flash memory can be reduced. The speed of the three-dimensional NAND flash memory can be increased.

As described above, according to the second embodiment, the fluorine concentration of the inter-cell region 16b of the charge storage layer 16 is increased, and thus, it is possible to provide the semiconductor memory device capable of suppressing the lateral migration of the electrons and improving the charge retention characteristics.

Third Embodiment

A semiconductor memory device according to a third embodiment is different from the semiconductor device according to the first embodiment in that the third insulating layer includes a ferroelectric material at least in a region between the first insulating layer and the first layer. Hereinafter, a part of contents overlapping the contents of the first embodiment will not be described.

Figure 8:
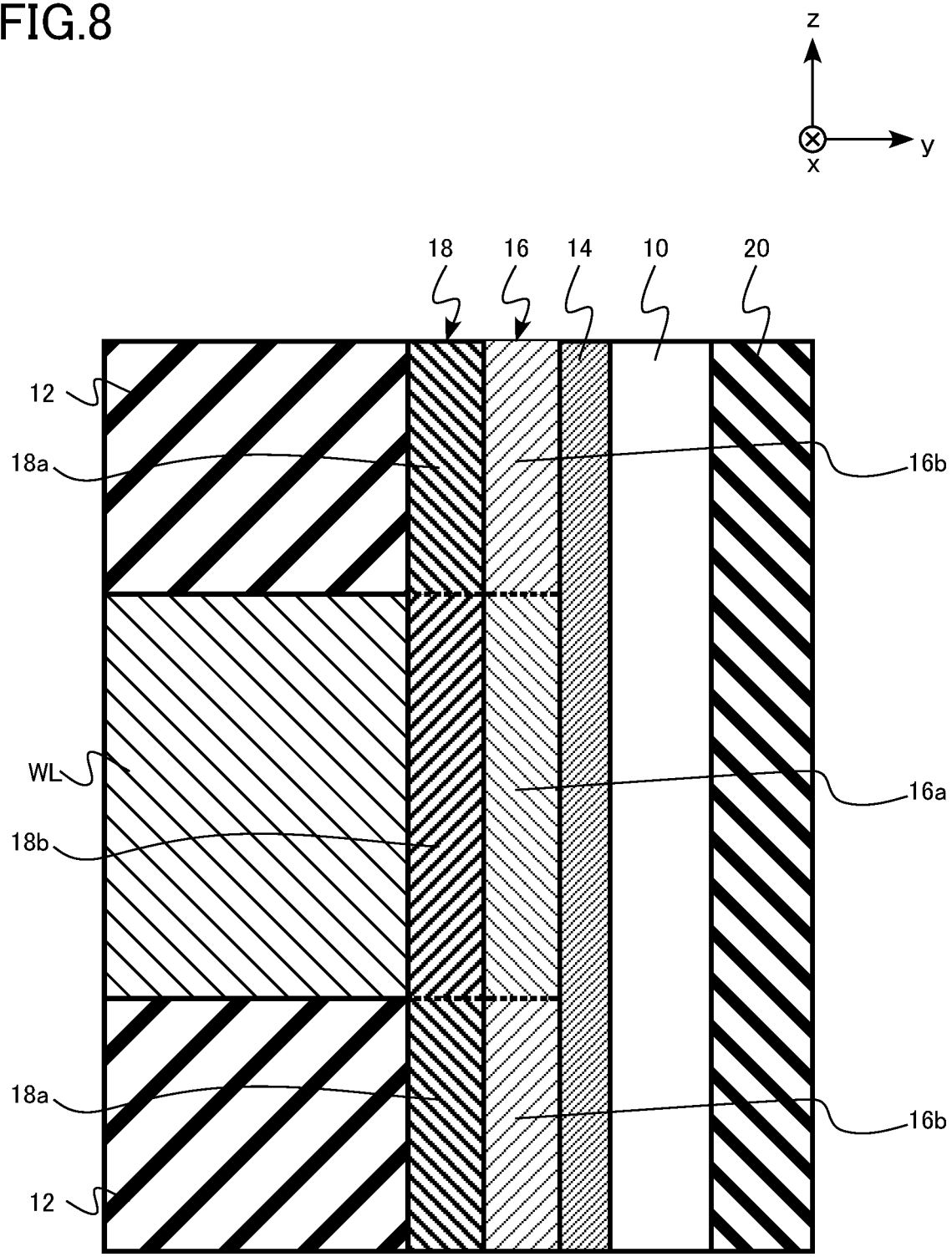
FIG. 8 is a schematic cross-sectional view of a memory cell of a semiconductor memory device according to a third embodiment.

FIG. 8 is a schematic cross-sectional view of the memory cell of the semiconductor memory device according to the third embodiment. FIG. 8 is an enlarged cross-sectional view of a part of the memory cell. FIG. 8 is a diagram corresponding to FIG. 3 of the first embodiment.

The first block insulating layer 18 contains a ferroelectric material at least in part. The first block insulating layer 18 contains, for example, at least one metal element of hafnium (Hf) or zirconium (Zr) and oxygen (O). The first block insulating layer 18 contains, for example, at least one of a hafnium oxide and a zirconium oxide. The first block insulating layer 18 is, for example, a hafnium oxide or a zirconium oxide.

As illustrated in FIG. 8, the first block insulating layer 18 includes a ferroelectric region 18a and a paraelectric region 18b. The ferroelectric region 18a is provided between the interlayer insulating layer 12 and the charge storage layer 16. The ferroelectric region 18a is provided between the interlayer insulating layer 12 and the inter-cell region 16b.

The paraelectric region 18b is provided between the word line WL and the charge storage layer 16. The paraelectric region 18b is provided between the word line WL and the charge storage region 16a.

The ferroelectric region 18a contains a ferroelectric material. The ferroelectric region 18a has ferroelectricity.

The ferroelectric region 18a contains, for example, at least one metal element of hafnium (Hf) or zirconium (Zr) and oxygen (O). For example, the ferroelectric region 18a contains, as a main constituent substance, a crystal of an orthorhombic crystal system or trigonal crystal system. The fact that the crystal of the orthorhombic crystal system or the trigonal crystal system is used as the main constituent substance means that the crystal of the orthorhombic crystal system or the trigonal crystal system exhibits the highest abundance among the substances constituting the ferroelectric region 18a.

The paraelectric region 18b contains a paraelectric material. The paraelectric region 18b has paraelectricity. The paraelectric region 18b contains, for example, at least one metal element of hafnium (Hf) or zirconium (Zr) and oxygen (O). The paraelectric region 18b contains, as a main constituent substance, a crystal other than the orthorhombic system and the trigonal crystal system. The fact that the crystal of the orthorhombic crystal system or the trigonal crystal system is used as the main constituent substance means that a substance other than the orthorhombic crystal system and the trigonal crystal system among the substances constituting the paraelectric region 18b exhibits the highest abundance.

A hafnium oxide has ferroelectricity in a case where the hafnium oxide is the crystal of the orthorhombic crystal system or the trigonal crystal system. In a case where the hafnium oxide is the crystal of the orthorhombic crystal or the trigonal crystal system, the hafnium oxide is a ferroelectric substance.

The hafnium oxide has ferroelectricity, for example, in a case where the hafnium oxide is the crystal of the third orthorhombic system (Orthorhombic III, Space Group: $Pbc2_1$, Space Group No. 29) or the trigonal system (Trigonal, Space Group: R3m or P3 or R3, Space Group No. 160 or 143 or 146).

The hafnium oxide does not have ferroelectricity in a case where the hafnium oxide is the crystal other than the crystal of the orthorhombic crystal system or the trigonal crystal system or in a case where the hafnium oxide is amorphous. The hafnium oxide is a paraelectric substance in a case where the hafnium oxide is the crystal other than the crystal of the orthorhombic crystal system or the trigonal crystal system or in a case where the hafnium oxide is amorphous. The fact that the hafnium oxide is the crystal other than the crystal of the orthorhombic crystal system or the trigonal crystal system is a cubic crystal system, a hexagonal crystal system, a tetragonal crystal system, a monoclinic crystal system, or a triclinic crystal system.

A zirconium oxide has ferroelectricity in a case where the zirconium oxide is the crystal of the orthorhombic crystal system or the trigonal crystal system. In a case where the zirconium oxide is the crystal of the orthorhombic crystal system or the trigonal crystal system, the zirconium oxide is a ferroelectric substance.

The zirconium oxide has ferroelectricity, for example, in a case where the zirconium oxide is the crystal of the third orthorhombic system (Orthorhombic III, Space Group: $Pbc2_1$, Space Group No. 29) or the trigonal system (Trigonal, Space Group: R3m or P3 or R3, Space Group No. 160 or 143 or 146).

The zirconium oxide does not have ferroelectricity in a case where the zirconium oxide is the crystal other than the orthorhombic crystal system or the trigonal crystal system or in a case where the zirconium oxide is amorphous. The zirconium oxide is a paraelectric substance in a case where the zirconium oxide is the crystal other than the orthorhombic crystal system or the trigonal crystal system, or when the zirconium oxide is amorphous.

In the first block insulating layer 18, the ferroelectric region 18a is provided between the interlayer insulating layer 12 and the inter-cell region 16b. As a result, the electrons trapped in the trap level of the inter-cell region 16b are attracted to the ferroelectric region 18a. Accordingly, the movement of the electrons in the inter-cell region 16b is suppressed. Accordingly, the migration of the electrons is further suppressed, and the charge retention characteristics of the three-dimensional NAND flash memory are further improved.

The paraelectric region 18b may not be provided in the first block insulating layer 18, and the entire first block insulating layer 18 may contain a ferroelectric material.

As described above, according to the third embodiment, the fluorine concentration of the inter-cell region 16b of the charge storage layer 16 is increased, and thus, it is possible to provide the semiconductor memory device capable of suppressing the lateral migration of the electrons and improving the charge retention characteristics.

Fourth Embodiment

A semiconductor memory device according to a fourth embodiment includes a first gate electrode layer extending in a first direction, a second gate electrode layer extending in the first direction and adjacent to the first gate electrode layer in a second direction crossing the first direction, a semiconductor layer provided between the first gate electrode layer and the second gate electrode layer, and extending in a third direction crossing the first direction and the second direction, a third gate electrode layer extending in the first direction and adjacent to the first gate electrode layer in the third direction, a first insulating layer provided between the first gate electrode layer and the third gate electrode layer, a second insulating layer provided between the semiconductor layer and the first gate electrode layer and between the semiconductor layer and the first insulating layer, a third insulating layer provided between the second insulating layer and the first gate electrode layer and between the second insulating layer and the first insulating layer, and a first layer provided between the second insulating layer and the third insulating layer. The first layer contains silicon (Si) and nitrogen (N), and includes a first region between the first gate electrode layer and the semiconductor layer and a second region between the first insulating layer and the semiconductor layer, the first region contains or does not contain fluorine (F), the second region contains fluorine (F), and a fluorine concentration of the second region is higher than a fluorine concentration of the first region.

The semiconductor memory device according to the fourth embodiment is a three-dimensional NAND flash memory. The memory cell of the semiconductor memory device according to the fourth embodiment is a so-called Metal-Oxide-Nitride-Oxide-Semiconductor type (MONOS type) memory cell.

The semiconductor memory device according to the fourth embodiment is different from the semiconductor memory device according to the first embodiment in the structure of the memory cell array. Specifically, although the memory cell array according to the first embodiment has a structure in which the semiconductor layer in which the channel of the memory cell transistor is formed is surrounded by the gate electrode layer, the memory cell array according to the fourth embodiment has a structure in which the semiconductor layer is sandwiched between two electrically isolated gate electrode layers. Hereinafter, a part of contents overlapping the contents of the first embodiment will not be described.

Figure 9:
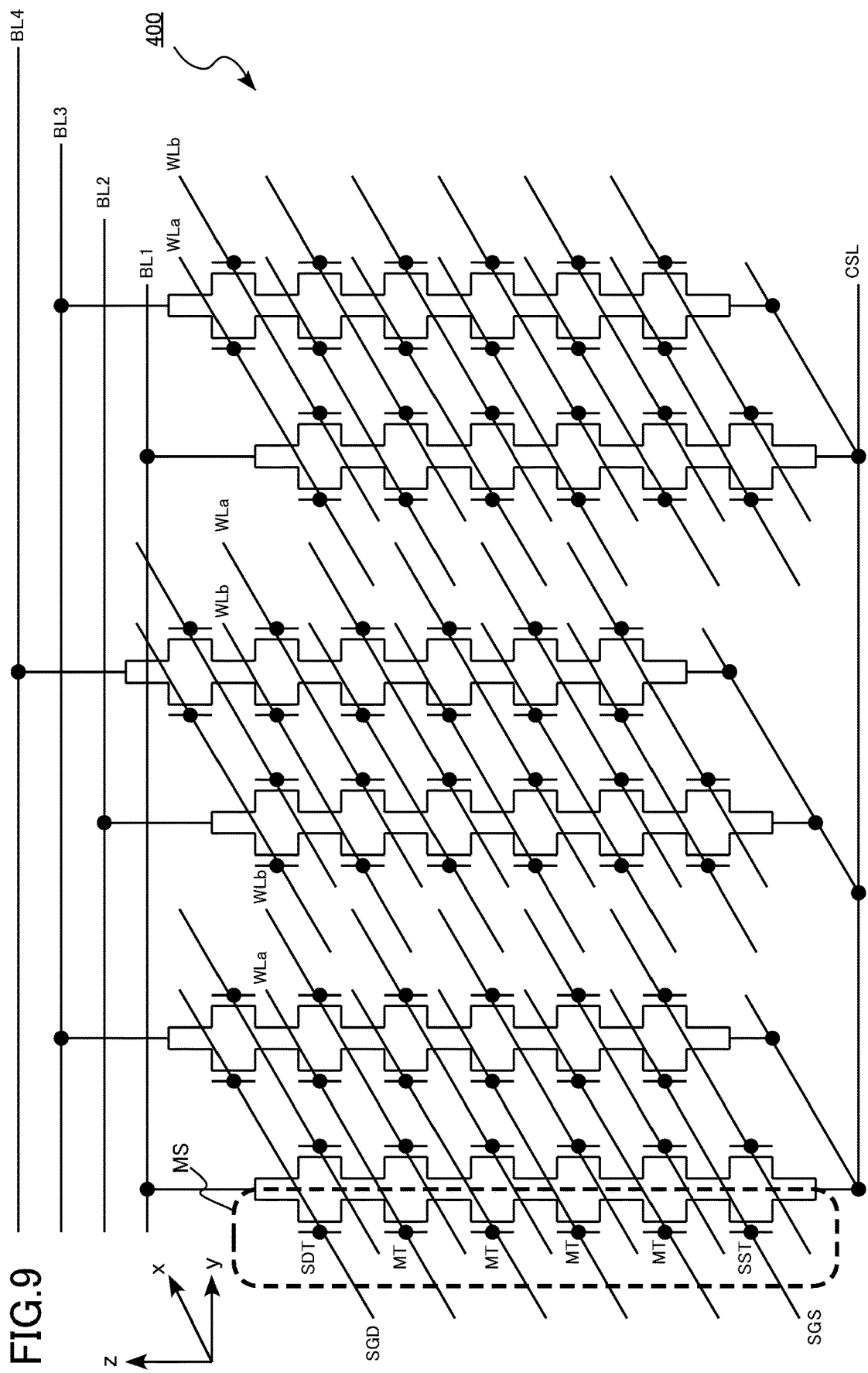
FIG. 9 is a circuit diagram of a memory cell array of a semiconductor memory device according to a fourth embodiment.

FIG. 9 is a circuit diagram of the memory cell array of the semiconductor memory device according to the fourth embodiment.

As illustrated in FIG. 9, a memory cell array 400 of the three-dimensional NAND flash memory of the fourth embodiment includes a source selection transistor SST, a drain selection transistor SDT, word lines WLa and WLb, bit lines BL1 to BL4, a common source line CSL, a source selection gate line SGS, a drain selection gate line SGD, and a memory string MS.

Hereinafter, an x direction illustrated in FIG. 9 is an example of a first direction. A y direction is an example of a second direction. A z direction is an example of a third direction. The y direction crosses the x direction. The z direction crosses the x direction and the y direction. For example, the x direction and the y direction are orthogonal to each other. For example, the z direction, the x direction, and the y direction are orthogonal to each other.

As illustrated in FIG. 9, the memory string MS includes a source selection transistor SST, a plurality of memory cells, and a drain selection transistor SDT connected in series between the common source line CSL and the bit line BL. One memory string MS is selected by selecting one bit line BL and one drain selection gate line SGD, and one memory cell can be selected by selecting one word line WL. The word line WL is a gate electrode of a memory cell transistor MT constituting the memory cell.

The word lines WLa and WLb extend in the x direction. The word lines WLa and WLb are connected to a gate electrode of the memory cell transistor MT. The word lines WLa and WLb control the gate voltage of the memory cell transistor MT.

The word line WLa and the word line WLb are electrically isolated. The word line WLa and the word line WLa are electrically connected. The word line WLb and the word line WLb are electrically connected.

The source selection transistor SST is electrically connected to the common source line CSL. The source selection transistor SST is controlled by a voltage applied to the source selection gate line SGS.

The drain selection transistor SDT is connected to the bit lines BL1 to BL4. The drain selection transistor SDT is controlled by a voltage applied to the drain selection gate line SGD.

Although FIG. 9 illustrates a case where the number of memory cells connected in series is four and the number of bit lines is four, the number of memory cells connected in series is not limited to four or the number of bit lines is not limited to four.

Figure 10:
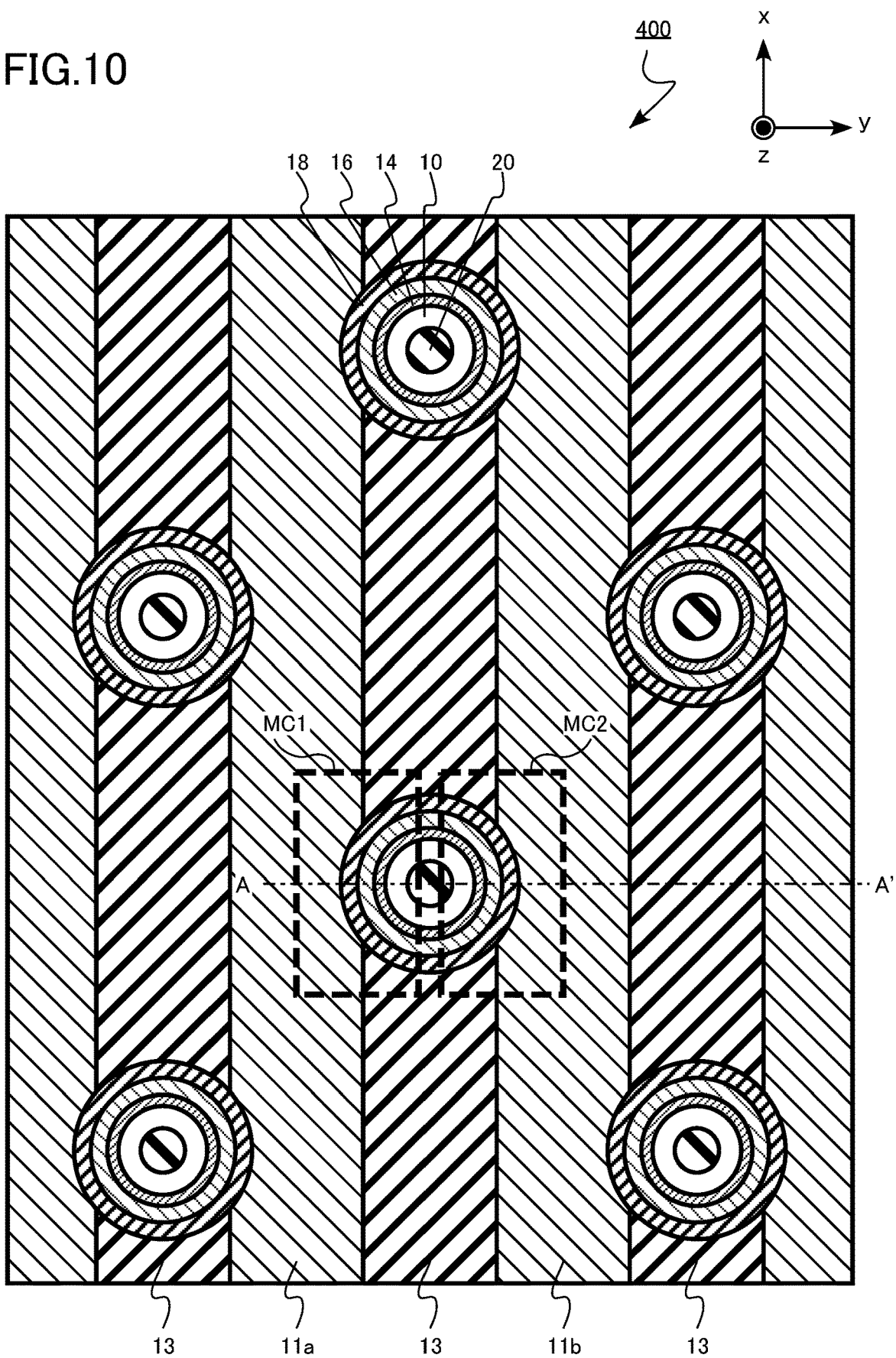
FIG. 10 is a schematic cross-sectional view of the memory cell array of the semiconductor memory device according to the fourth embodiment.
Figure 11:
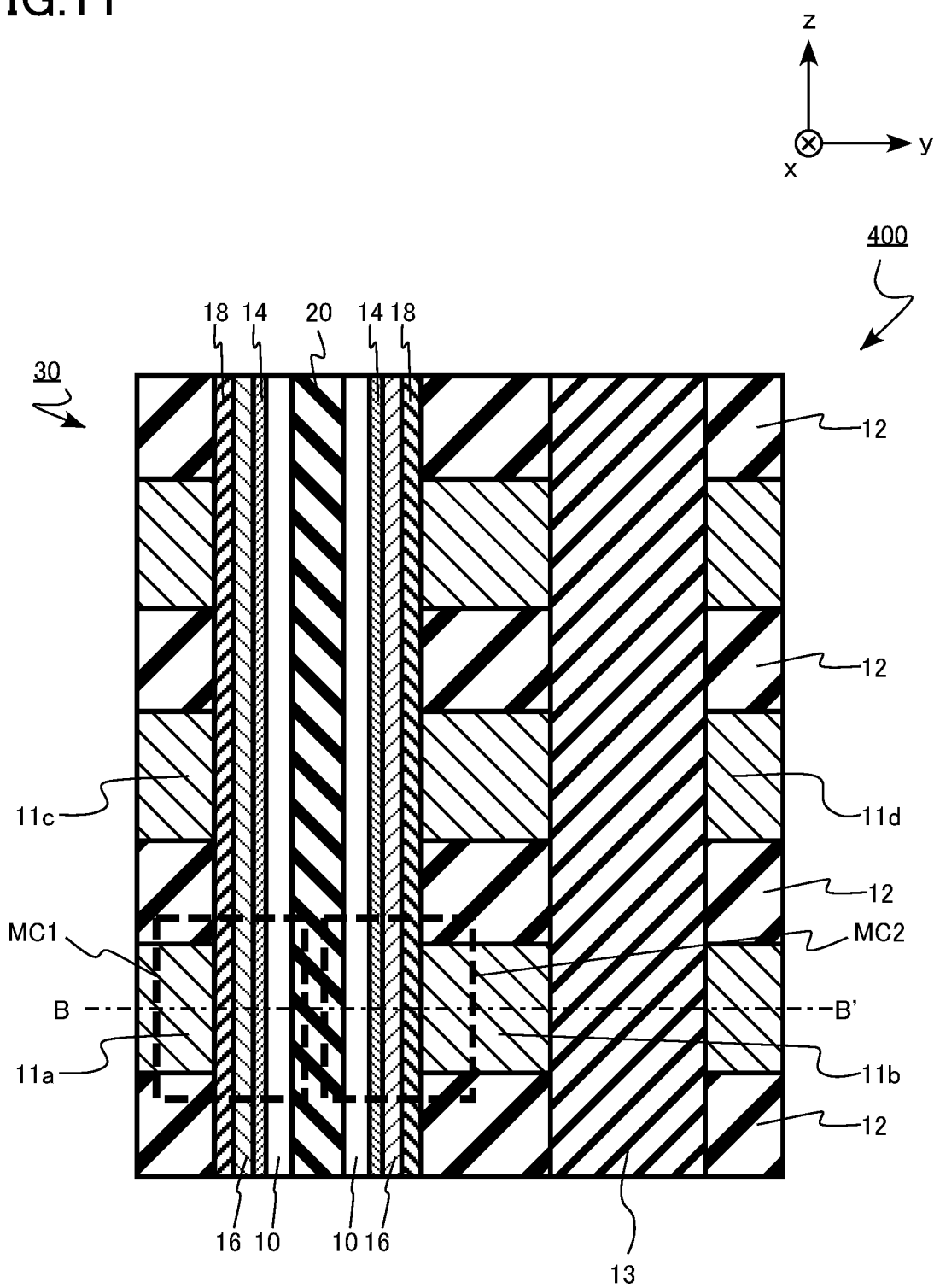
FIG. 11 is a schematic cross-sectional view of the memory cell array of the semiconductor memory device according to the fourth embodiment.

FIGS. 10 and 11 are schematic cross-sectional views of the memory cell array of the semiconductor memory device according to the fourth embodiment. FIG. 10 is an xy cross section of the memory cell array 400. FIG. 10 is a cross section including a BB' plane of FIG. 11. FIG. 11 is an yz cross section of the memory cell array 400. FIG. 11 is an AA' cross section of FIG. 10.

In FIGS. 10 and 11, a region surrounded by a broken line is one memory cell. FIGS. 10 and 11 illustrate a memory cell MC1 and a memory cell MC2 adjacent to each other in the y direction.

Figure 12:
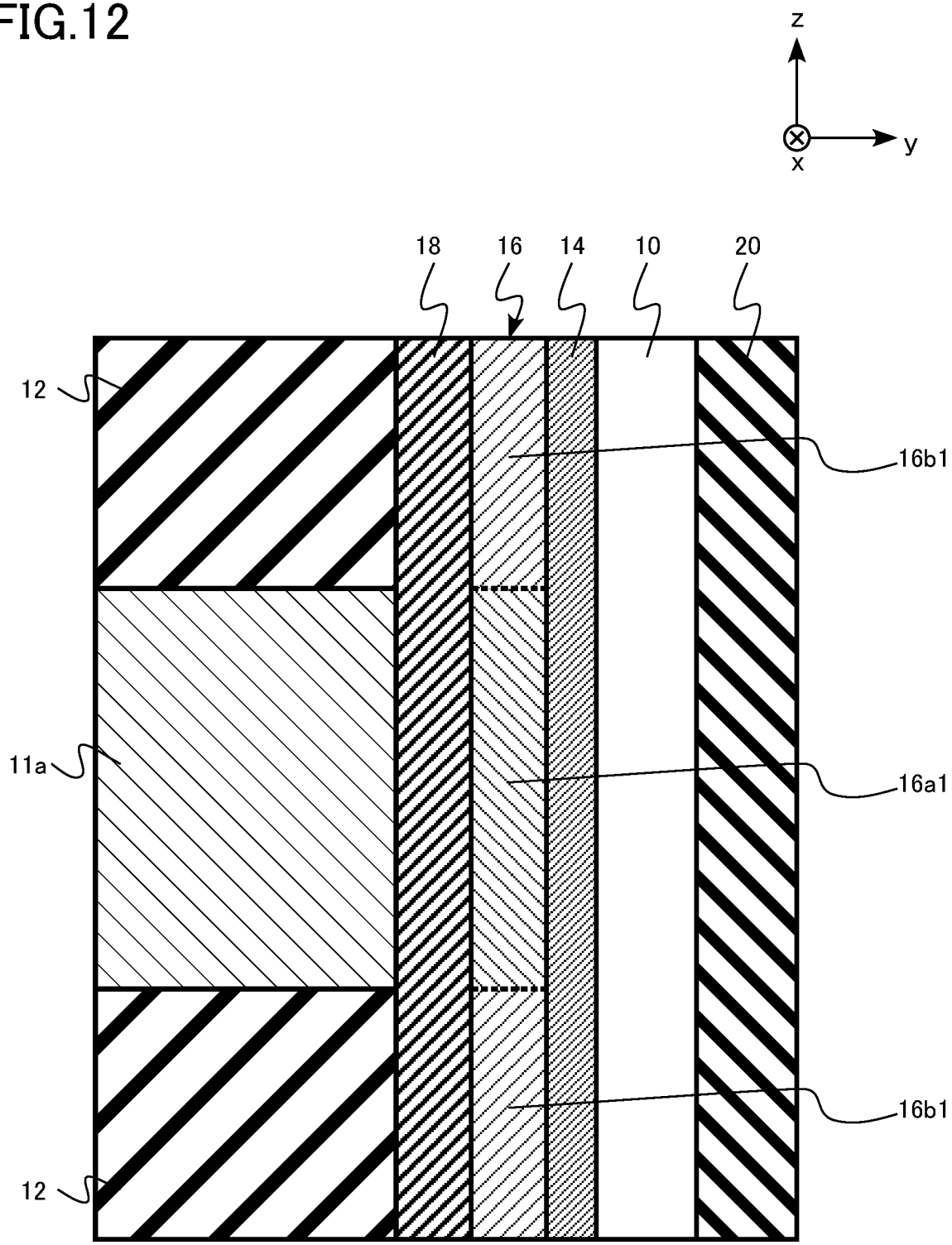
FIG. 12 is a schematic cross-sectional view of a memory cell of the semiconductor memory device according to the fourth embodiment.

FIG. 12 is a schematic cross-sectional view of the memory cell of the semiconductor memory device according to the fourth embodiment. FIG. 12 is an enlarged cross-sectional view of a part of the memory cell. FIG. 12 is an enlarged view of a part of FIG. 11.

Figure 13:
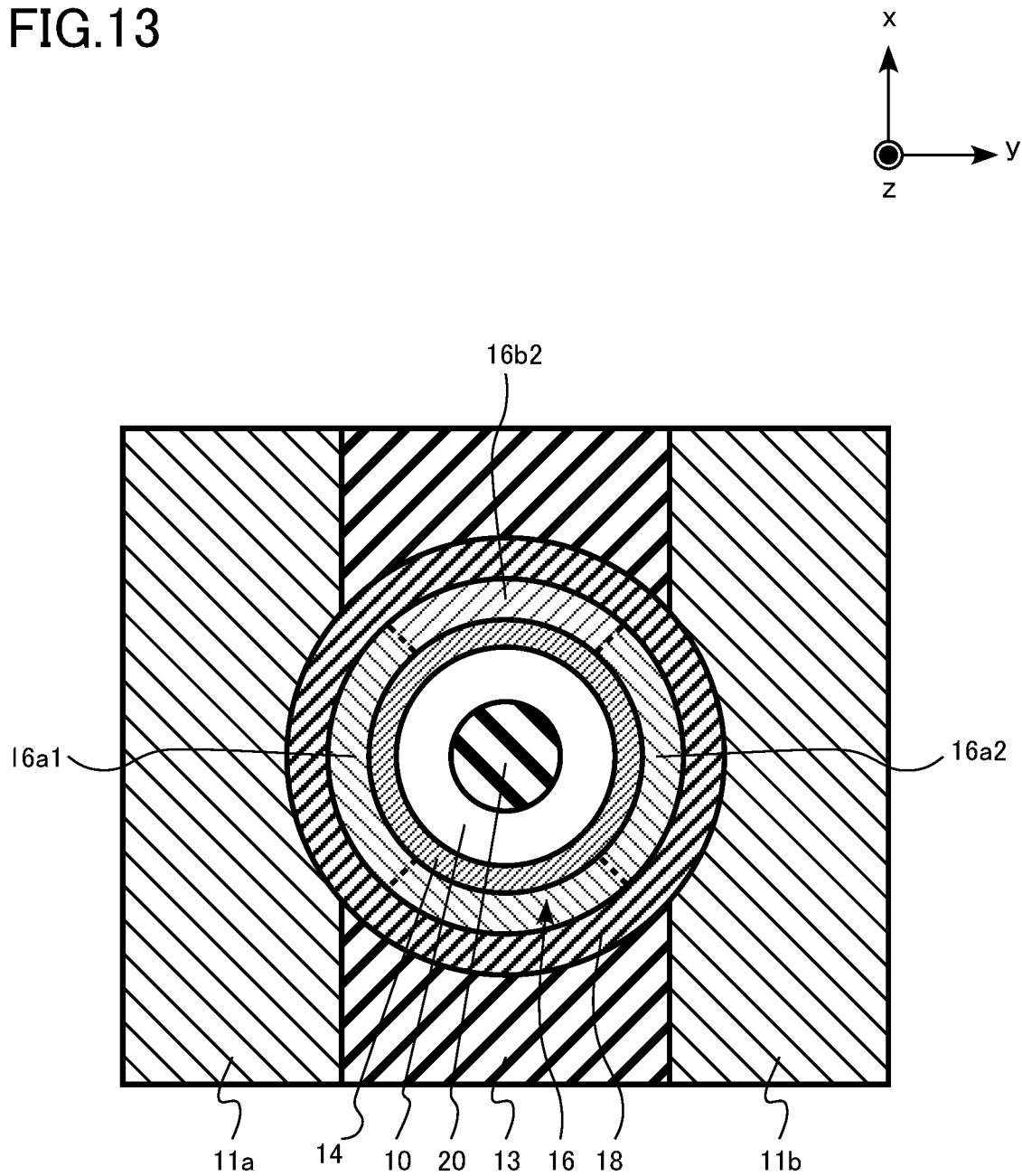
FIG. 13 is a schematic cross-sectional view of the memory cell of the semiconductor memory device according to the fourth embodiment.

FIG. 13 is a schematic cross-sectional view of the memory cell of the semiconductor memory device according to the fourth embodiment. FIG. 13 is an enlarged view of a part of FIG. 10.

The memory cell array 400 includes semiconductor layers 10, first gate electrode layers 11a, second gate electrode layers 11b, third gate electrode layers 11c, fourth gate electrode layers 11d, interlayer insulating layers 12, trench insulating layers 13, tunnel insulating layers 14, charge storage layers 16, first block insulating layers 18, and a core insulating region 20. The charge storage layer 16 includes a first charge storage region 16a1, a second charge storage region 16a2, a first inter-cell region 16b1, and a second inter-cell region 16b2.

The interlayer insulating layer 12 is an example of a first insulating layer. The tunnel insulating layer 14 is an example of a second insulating layer. The first block insulating layer 18 is an example of a third insulating layer. The charge storage layer 16 is an example of a first layer. The first charge storage region 16a1 is an example of a first region. The second charge storage region 16a2 is an example of a third region. The first inter-cell region 16b1 is an example of a second region. The second inter-cell region 16b2 is an example of a fourth region.

The memory cell array 400 is provided, for example, on a semiconductor substrate (not illustrated). The semiconductor substrate has a surface parallel to the x direction and the y direction.

The first gate electrode layer 11a extends in the x direction. The first gate electrode layer 11a corresponds to, for example, the word line WLa illustrated in FIG. 9. The first gate electrode layer 11a functions as a gate electrode of the transistor of the memory cell MC1.

The second gate electrode layer 11b extends in the x direction. The second gate electrode layer 11b is adjacent to the first gate electrode layer 11a in the y direction. The second gate electrode layer 11b corresponds to, for example, the word line WLb illustrated in FIG. 9. The second gate electrode layer 11b functions as a gate electrode of the transistor of the memory cell MC2.

The third gate electrode layer 11c extends in the x direction. The third gate electrode layer 11c is adjacent to the first gate electrode layer 11a in the z direction. The third gate electrode layer 11c corresponds to, for example, the word line WLa illustrated in FIG. 9. The third gate electrode layer 11c functions as a gate electrode of the transistor of the memory cell.

The fourth gate electrode layer 11d extends in the x direction. The fourth gate electrode layer 11d is adjacent to the third gate electrode layer 11c in the y direction. The fourth gate electrode layer 11d is adjacent to the second gate electrode layer 11b in the z direction. The fourth gate electrode layer 11d corresponds to, for example, the word line WLb illustrated in FIG. 9. The fourth gate electrode layer 11d functions as a gate electrode of the transistor of the memory cell.

The first gate electrode layer 11a, the second gate electrode layer 11b, the third gate electrode layer 11c, and the fourth gate electrode layer 11d are, for example, a metal, a metal nitride, a metal carbide, or a semiconductor. The first gate electrode layer 11a, the second gate electrode layer 11b, the third gate electrode layer 11c, and the fourth gate electrode layer 11d are, for example, tungsten (W).

The semiconductor layer 10 is provided between the first gate electrode layer 11a and the second gate electrode layer 11b. The semiconductor layer 10 is provided between the third gate electrode layer 11c and the fourth gate electrode layer 11d. The semiconductor layer 10 extends in the z direction. The semiconductor layer 10 has, for example, a cylindrical shape.

The semiconductor layer 10 functions as a channel of the memory cell transistor MT.

The semiconductor layer 10 is, for example, a polycrystalline semiconductor. The semiconductor layer 10 includes, for example, polycrystalline silicon. The semiconductor layer 10 is, for example, polycrystalline silicon. A thickness of the semiconductor layer 10 in the xy plane is, for example, equal to or more than 5 nm and equal to or less than 30 nm.

The interlayer insulating layer 12 is provided between the first gate electrode layer 11a and the third gate electrode layer 11c and between the second gate electrode layer 11b and the fourth gate electrode layer 11d.

The interlayer insulating layer 12 is, for example, an oxide, an oxynitride, or a nitride. The interlayer insulating layer 12 contains, for example, a silicon oxide. The interlayer insulating layer 12 is, for example, a silicon oxide. A thickness of the interlayer insulating layer 12 in the z direction is, for example, equal to or more than 5 nm and equal to or less than 30 nm.

The interlayer insulating layer 12 contains, for example, fluorine (F). A fluorine concentration of the interlayer insulating layer 12 is, for example, equal to or more than $1 \times 10^{19}$ atoms/cm$^3$ and equal to or less than $1 \times 10^{22}$ atoms/cm$_3$.

The trench insulating layer 13 is provided between the first gate electrode layer 11a and the second gate electrode layer 11b. The trench insulating layer 13 is provided between the third gate electrode layer 11c and the fourth gate electrode layer 11d. The trench insulating layer 13 is adjacent to the semiconductor layer 10 in the x direction.

The trench insulating layer 13 is, for example, an oxide, an oxynitride, or a nitride. The trench insulating layer 13 contains, for example, a silicon oxide. The trench insulating layer 13 is, for example, a silicon oxide.

The trench insulating layer 13 contains, for example, fluorine (F). A fluorine concentration of the trench insulating layer 13 is, for example, equal to or more than $1 \times 10^{19}$ atoms/cm$^3$ and equal to or less than $1 \times 10^{22}$ atoms/cm$^3$.

The tunnel insulating layer 14 surrounds the semiconductor layer 10. The tunnel insulating layer 14 is provided between the semiconductor layer 10 and the first gate electrode layer 11a. The tunnel insulating layer 14 is provided between the semiconductor layer 10 and the second gate electrode layer 11b. The tunnel insulating layer 14 is provided between the semiconductor layer 10 and the third gate electrode layer 11c. The tunnel insulating layer 14 is provided between the semiconductor layer 10 and the fourth gate electrode layer 11d.

The tunnel insulating layer 14 is provided between the semiconductor layer 10 and the charge storage layer 16. The tunnel insulating layer 14 is also provided between the semiconductor layer 10 and the interlayer insulating layer 12. The tunnel insulating layer 14 has a function of causing charges to pass in accordance with a voltage applied between the gate electrode layer and the semiconductor layer 10.

The tunnel insulating layer 14 contains, for example, silicon (Si), nitrogen (N), and oxygen (O). The tunnel insulating layer 14 includes, for example, a silicon nitride or a silicon oxynitride. A thickness of the tunnel insulating layer 14 is, for example, equal to or more than 3 nm and equal to or less than 8 nm.

The tunnel insulating layer 14 includes, for example, a lower layer portion, an intermediate portion, and an upper layer portion. The lower layer portion is provided between the semiconductor layer 10 and the intermediate portion. The intermediate portion is provided between the lower layer portion and the upper layer portion. The upper layer portion is provided between the intermediate portion and the charge storage layer 16. The lower layer portion is, for example, a silicon oxide. The intermediate portion is, for example, a silicon nitride or a silicon oxynitride. The upper layer portion is, for example, a silicon oxide.

The charge storage layer 16 is provided between the tunnel insulating layer 14 and the first block insulating layer 18. The charge storage layer 16 surrounds the semiconductor layer 10.

The charge storage layer 16 has a function of trapping and storing charges. The charge is, for example, an electron. A threshold voltage of the memory cell transistor MT changes in accordance with the amount of charges stored in the charge storage layer 16. One memory cell can store data by using this change in the threshold voltage.

For example, the threshold voltage of the memory cell transistor MT changes, and thus, a voltage at which the memory cell transistor MT is turned on changes. For example, when a state where the threshold voltage is high is defined as data "0" and a state where the threshold voltage is low is defined as data "1", the memory cell can store one-bit data of "0" and "1".

The charge storage layer 16 contains silicon (Si) and nitrogen (N). The charge storage layer 16 contains, for example, a silicon nitride. The charge storage layer 16 is, for example, a silicon nitride. A thickness of the charge storage layer 16 is, for example, equal to or more than 3 nm and equal to or less than 10 nm.

As illustrated in FIG. 12, the charge storage layer 16 includes a first charge storage region 16a1 and a first inter-cell region 16b1. The first charge storage region 16a1 is provided between the first gate electrode layer 11a and the semiconductor layer 10. The first inter-cell region 16b1 is provided between the interlayer insulating layer 12 and the semiconductor layer 10.

The first charge storage region 16a1 contains silicon (Si) and nitrogen (N). The first charge storage region 16a1 contains or does not contain fluorine (F). The first inter-cell region 16b1 contains silicon (Si), nitrogen (N), and fluorine (F). A fluorine concentration of the first inter-cell region 16bl is higher than a fluorine concentration of the first charge storage region 16a1.

The fluorine concentration of the first inter-cell region 16b1 is, for example, equal to or more than $1 \times 10^{19}$ atoms/cm$^3$ and equal to or less than $1 \times 10^{20}$ atoms/cm$^3$. The fluorine concentration of the first charge storage region 16al is, for example, less than $1 \times 10^{19}$ atoms/cm$^3$.

An atomic ratio of nitrogen (N) to silicon (Si) in the charge storage layer 16 is, for example, equal to or more than 1.2.

An atomic ratio (N/Si) of nitrogen (N) to silicon (Si) in the first charge storage region 16al is larger than an atomic ratio (N/Si) of nitrogen (N) to silicon (Si) in the first inter-cell region 16b1.

The atomic ratio (N/Si) of nitrogen (N) to silicon (Si) in the first charge storage region 16al is, for example, equal to or more than 1.25 and equal to or less than 1.4. An atomic ratio (N/Si) of nitrogen (N) to silicon (Si) in the first inter-cell region 16b1 is, for example, equal to or more than 1.2 and less than 1.25.

For example, fluorine is thermally diffused from the interlayer insulating layer 12 containing fluorine, and thus, the fluorine concentration of the first inter-cell region 16b1 can be set to be higher than the fluorine concentration of the first charge storage region 16a1.

As illustrated in FIG. 13, the charge storage layer 16 includes a first charge storage region 16a1, a second charge storage region 16a2, and a second inter-cell region 16b2. The second charge storage region 16a2 is provided between the second gate electrode layer 11b and the semiconductor layer 10. The second inter-cell region 16b2 is provided between the first charge storage region 16a1 and the second charge storage region 16a2. The second inter-cell region 16b2 is provided between the trench insulating layer 13 and the semiconductor layer 10.

The first charge storage region 16a1 and the second charge storage region 16a2 include silicon (Si) and nitrogen (N). The first charge storage region 16a1 and the second charge storage region 16a2 include or do not contain fluorine (F). The second inter-cell region 16b2 contains silicon (Si), nitrogen (N), and fluorine (F). A fluorine concentration of the second inter-cell region 16b2 is higher than the fluorine concentration of the first charge storage region 16a1 and the fluorine concentration of the second charge storage region 16a2.

The fluorine concentration of the second inter-cell region 16b2 is, for example, equal to or more than $1 \times 10^{19}$ atoms/cm$^3$ and equal to or less than $1 \times 10^{20}$ atoms/cm$^3$. The fluorine concentration of the first charge storage region 16a1 and the fluorine concentration of the second charge storage region 16a2 are, for example, less than $1 \times 10^{19}$ atoms/cm$^3$.

An atomic ratio (N/Si) of nitrogen (N) to silicon (Si) in the first charge storage region 16a1 and the second charge storage region 16a2 is larger than an atomic ratio (N/Si) of nitrogen (N) to silicon (Si) in the second inter-cell region 16b2.

The atomic ratio (N/Si) of nitrogen (N) to silicon (Si) in the first charge storage region 16a1 and the second charge storage region 16a2 is, for example, equal to or more than 1.25 and equal to or less than 1.4. An atomic ratio (N/Si) of nitrogen (N) to silicon (Si) in the second inter-cell region 16b2 is, for example, equal to or more than 1.2 and less than 1.25.

For example, fluorine is thermally diffused from the trench insulating layer 13 containing fluorine, and thus, the fluorine concentration of the second inter-cell region 16b2 can be set to be higher than the fluorine concentration of the first charge storage region 16a1 and the fluorine concentration of the second charge storage region 16a2.

The first block insulating layer 18 surrounds the semiconductor layer 10. The first block insulating layer 18 is provided between the tunnel insulating layer 14 and the stacked body 30. The first block insulating layer 18 is provided between the tunnel insulating layer 14 and the first gate electrode layer 11a. The first block insulating layer 18 is provided between the tunnel insulating layer 14 and the second gate electrode layer 11b. The first block insulating layer 18 is provided between the tunnel insulating layer 14 and the third gate electrode layer 11c.

The first block insulating layer 18 is provided between the tunnel insulating layer 14 and the fourth gate electrode layer 11d.

The first block insulating layer 18 is provided between the charge storage layer 16 and the first gate electrode layer 11a. The first block insulating layer 18 is provided between the charge storage layer 16 and the second gate electrode layer 11b. The first block insulating layer 18 is provided between the charge storage layer 16 and the third gate electrode layer 11c. The first block insulating layer 18 is provided between the charge storage layer 16 and the fourth gate electrode layer 11d.

The first block insulating layer 18 is, for example, an oxide, an oxynitride, or a nitride. The first block insulating layer 18 contains, for example, silicon (Si) and oxygen (O). The first block insulating layer 18 is, for example, a silicon oxide. A thickness of the first block insulating layer 18 is, for example, equal to or more than 3 nm and equal to or less than 10 nm.

The core insulating region 20 extends in the z direction. The core insulating region 20 is surrounded by the semiconductor layer 10. The core insulating region 20 has a columnar shape. The core insulating region 20 has, for example, a cylindrical shape.

The core insulating region 20 is, for example, an oxide, an oxynitride, or a nitride. The core insulating region 20 contains, for example, silicon (Si) and oxygen (O). The core insulating region 20 is, for example, a silicon oxide.

In the three-dimensional NAND flash memory according to the fourth embodiment, the fluorine concentration of the first inter-cell region 16b1 and the fluorine concentration of the second inter-cell region 16b2 of the charge storage layer 16 are set to be higher than the fluorine concentration of the first charge storage region 16a1 and the fluorine concentration of the second charge storage region 16a2. Accordingly, the charge retention characteristics are improved by the same function as the function of the three-dimensional NAND flash memory according to the first embodiment. The threshold voltage fluctuation of the memory cell transistor MT is suppressed by the same function as the function of the three-dimensional NAND flash memory according to the first embodiment.

As described above, according to the fourth embodiment, the fluorine concentration in the first inter-cell region 16b1 and the fluorine concentration in the second inter-cell region 16b2 of the charge storage layer 16 are set to be higher than the fluorine concentration of the first charge storage region 16a1 and the fluorine concentration in the second charge storage region 16a2, and thus, it is possible to provide the semiconductor memory device capable of suppressing the lateral migration of the electrons and improving the charge retention characteristics.

Fifth Embodiment

A semiconductor memory device according to a fifth embodiment is different from the semiconductor memory device according to the fourth embodiment in that the semiconductor memory device further includes a fourth insulating layer provided between the first gate electrode layer and the third insulating layer and between the gate electrode layer and the first insulating layer, the fourth insulating layer including a fifth region between the first gate electrode layer and the third insulating layer and a sixth region between the first gate electrode layer and the first insulating layer, the fifth region containing or not containing fluorine (F), the sixth region containing fluorine (F), and the fluorine concentration of the sixth region being higher than the fluorine concentration of the fifth region. Hereinafter, a part of contents overlapping the contents of the first embodiment or the fourth embodiment will not be described.

Figure 14:
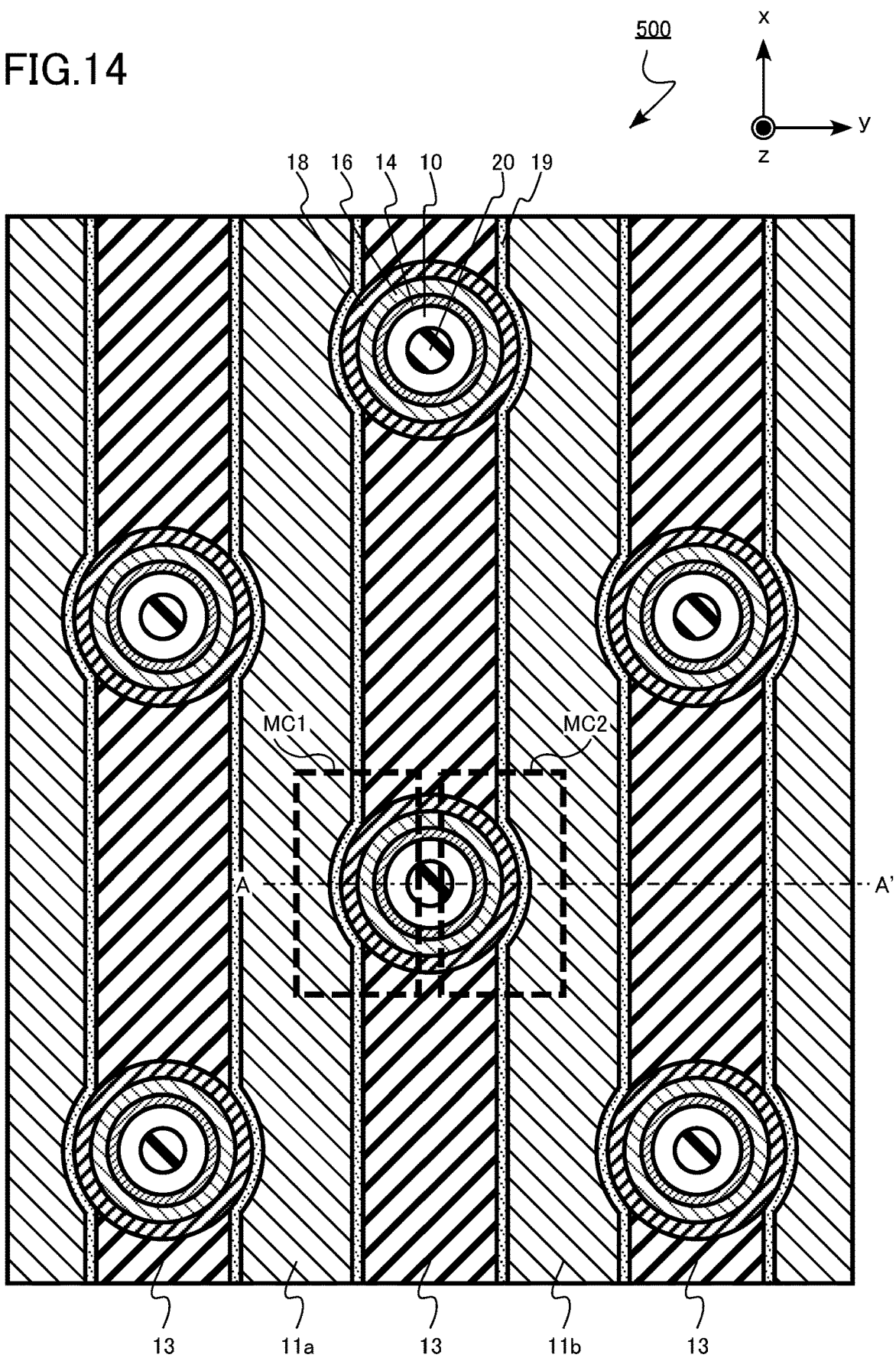
FIG. 14 is a schematic cross-sectional view of a memory cell array of a semiconductor memory device according to a fifth embodiment.
Figure 15:
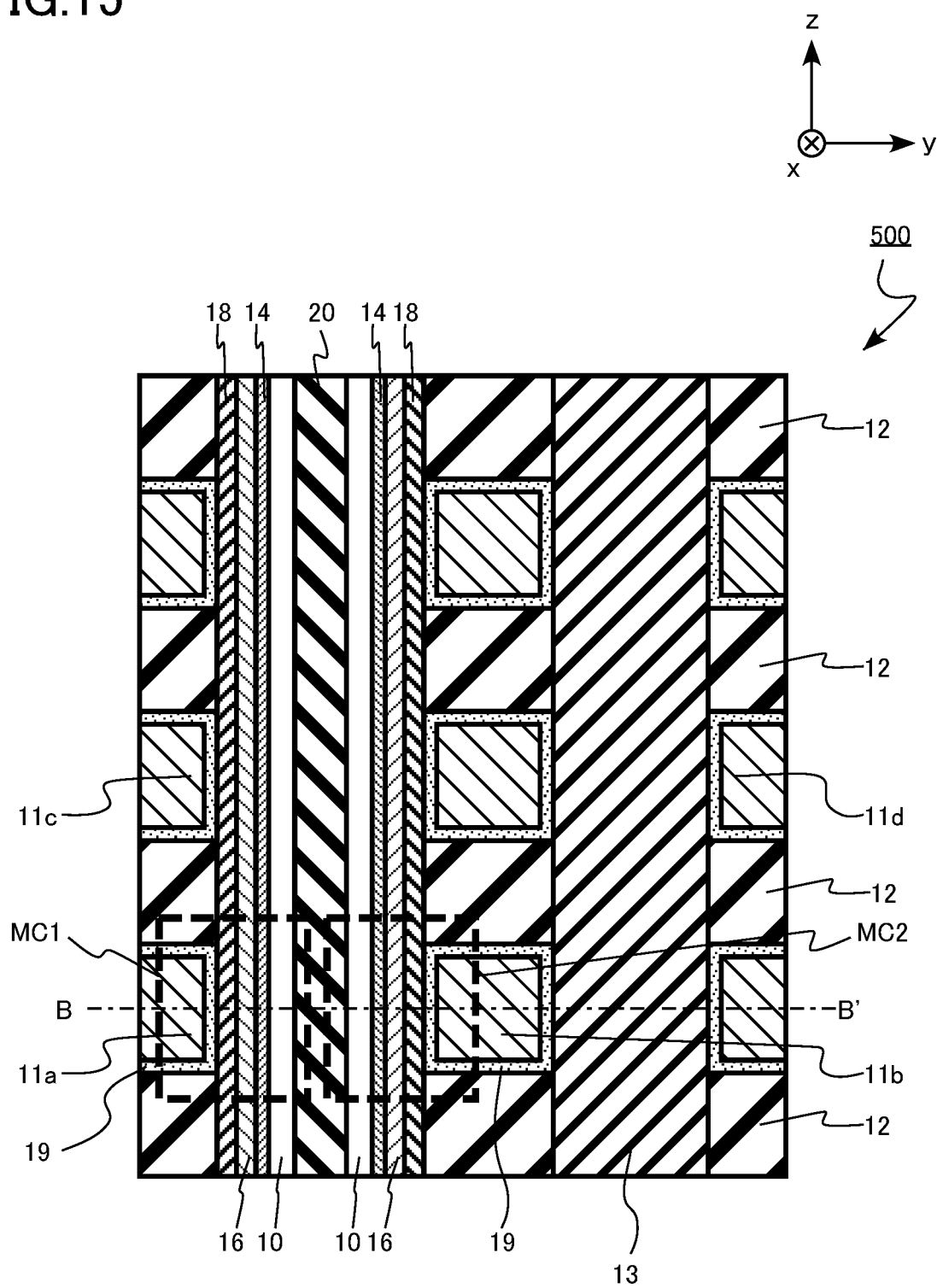
FIG. 15 is a schematic cross-sectional view of the memory cell array of the semiconductor memory device according to the fifth embodiment.

FIGS. 14 and 15 are schematic cross-sectional views of a memory cell array of a semiconductor memory device according to a fifth embodiment. FIG. 14 is an xy cross section of a memory cell array 500. FIG. 14 is a cross section including a BB' plane of FIG. 15. FIG. 15 is an yz cross section of the memory cell array 500. FIG. 15 is an AA' cross section of FIG. 14.

In FIGS. 14 and 15, a region surrounded by a broken line is one memory cell. FIGS. 15 and 14 illustrate a memory cell MC1 and a memory cell MC2 adjacent to each other in the y direction.

Figure 16:
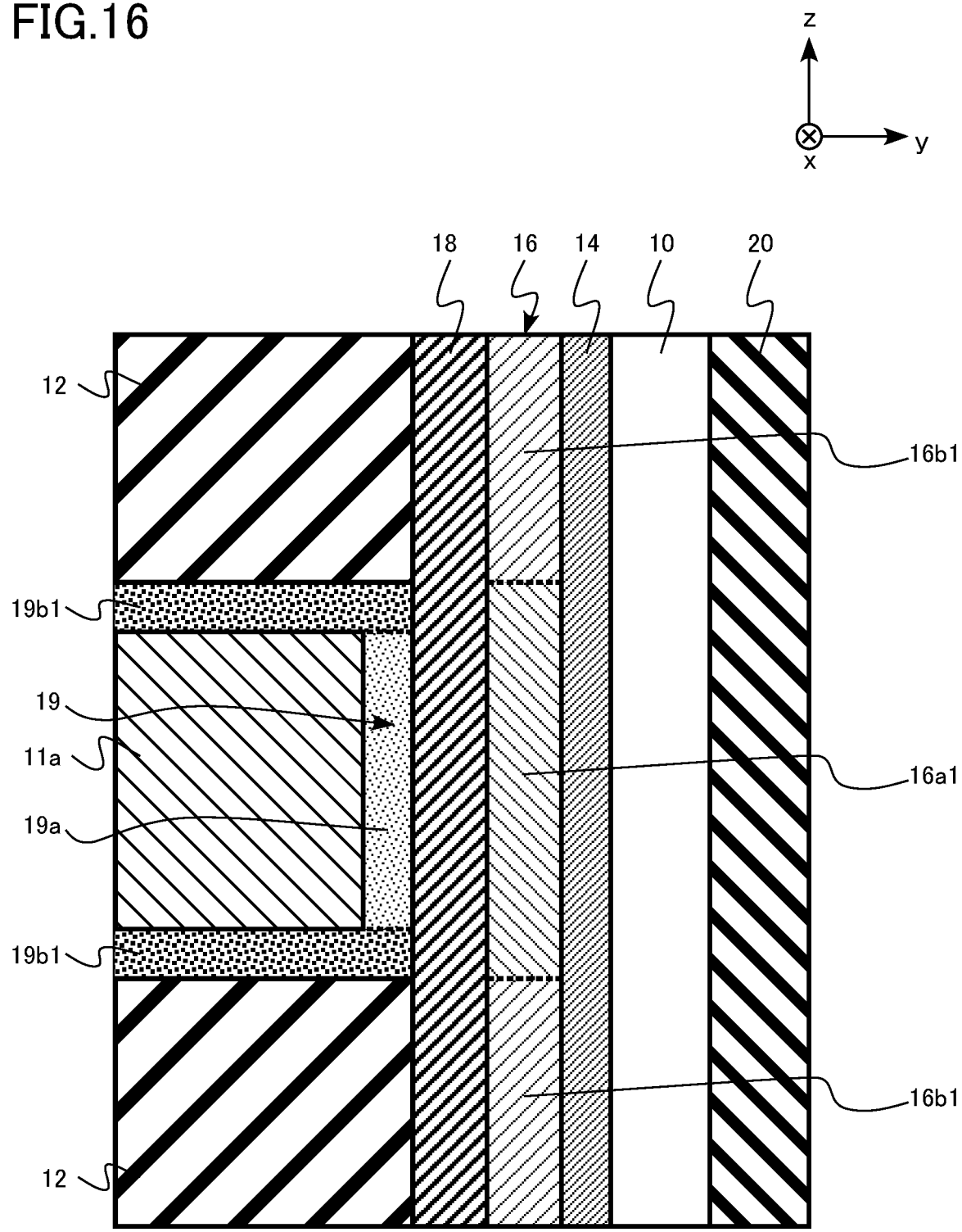
FIG. 16 is a schematic cross-sectional view of a memory cell of the semiconductor memory device according to the fifth embodiment.

FIG. 16 is a schematic cross-sectional view of the memory cell of the semiconductor memory device according to the fifth embodiment. FIG. 16 is an enlarged cross-sectional view of a part of the memory cell. FIG. 16 is an enlarged view of a part of FIG. 15.

Figure 17:
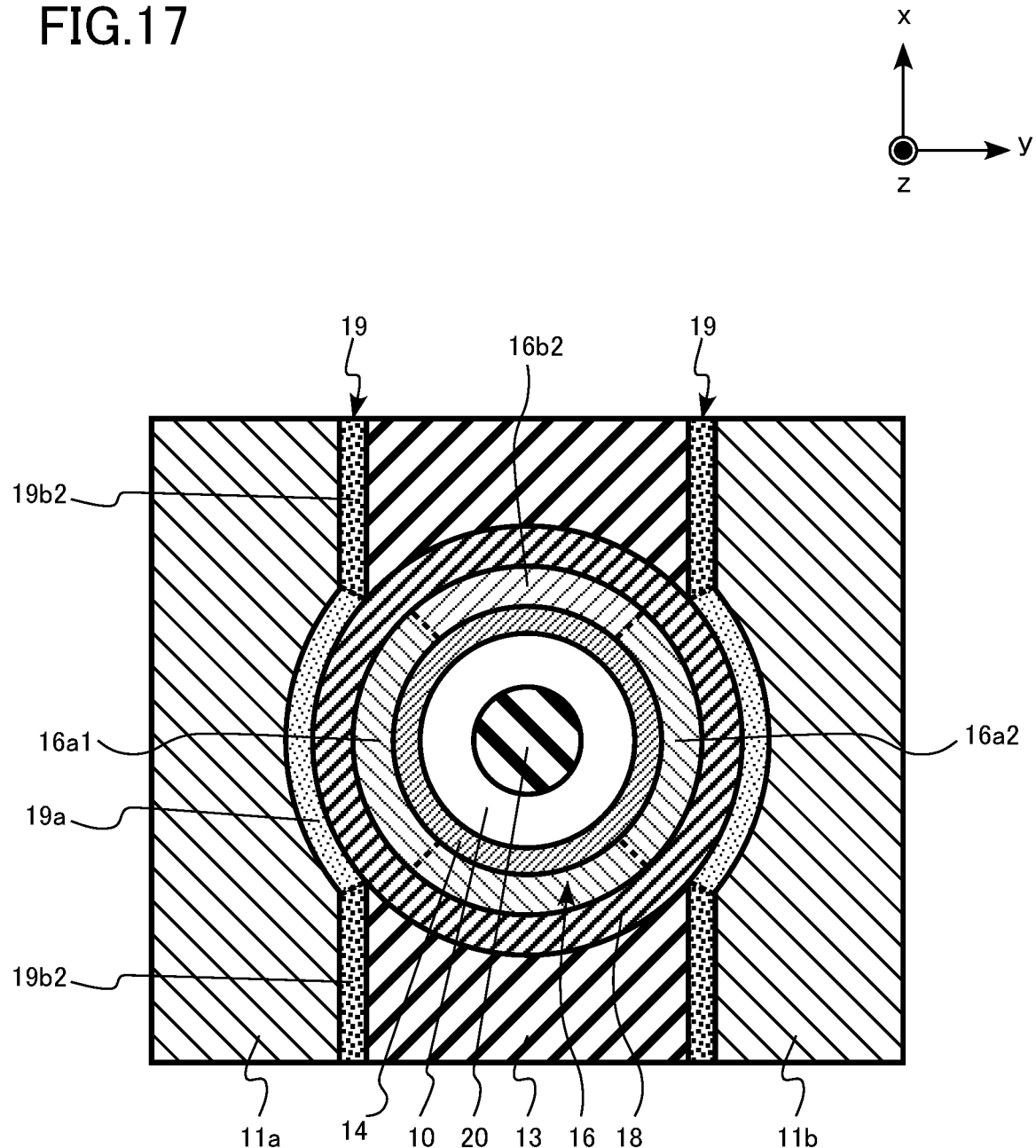
FIG. 17 is a schematic cross-sectional view of the memory cell of the semiconductor memory device according to the fifth embodiment.

FIG. 17 is a schematic cross-sectional view of the memory cell of the semiconductor memory device according to the fifth embodiment. FIG. 17 is an enlarged view of a part of FIG. 14.

The memory cell array 500 includes semiconductor layers 10, first gate electrode layers 11a, second gate electrode layers 11b, third gate electrode layers 11c, fourth gate electrode layers 11d, interlayer insulating layers 12, trench insulating layers 13, tunnel insulating layers 14, charge storage layers 16, first block insulating layers 18, second block insulating layers 19, and a core insulating region 20. The charge storage layer 16 includes a first charge storage region 16a1, a second charge storage region 16a2, a first inter-cell region 16b1, and a second inter-cell region 16b2. The second block insulating layer 19 includes a block region 19a, a first interlayer region 19b1, and a second interlayer region 19b2.

The interlayer insulating layer 12 is an example of a first insulating layer. The trench insulating layer 13 is an example of a fifth insulating layer. The tunnel insulating layer 14 is an example of a second insulating layer. The first block insulating layer 18 is an example of a third insulating layer. The charge storage layer 16 is an example of a first layer. The first charge storage region 16a1 is an example of a first region. The second charge storage region 16a2 is an example of a third region. The first inter-cell region 16b1 is an example of a second region. The second inter-cell region 16b2 is an example of a fourth region. The block region 19a is an example of a fifth region. The first interlayer region 19b1 is an example of a sixth region. The second interlayer region 19b2 is an example of a seventh region.

The second block insulating layer 19 is provided between the first gate electrode layer 11a and the first block insulating layer 18. The second block insulating layer 19 is provided between the second gate electrode layer 11b and the first block insulating layer 18. The second block insulating layer 19 is provided between the third gate electrode layer 11c and the first block insulating layer 18. The second block insulating layer 19 is provided between the fourth gate electrode layer 11d and the first block insulating layer 18.

The second block insulating layer 19 is provided between the first gate electrode layer 11a and the interlayer insulating layer 12. The second block insulating layer 19 is provided between the second gate electrode layer 11b and the interlayer insulating layer 12.

The second block insulating layer 19 is provided between the third gate electrode layer 11c and the interlayer insulating layer 12. The second block insulating layer 19 is provided between the fourth gate electrode layer 11d and the interlayer insulating layer 12.

The second block insulating layer 19 is provided between the first gate electrode layer 11a and the trench insulating layer 13. The second block insulating layer 19 is provided between the second gate electrode layer 11b and the trench insulating layer 13. The second block insulating layer 19 is provided between the third gate electrode layer 11c and the trench insulating layer 13. The second block insulating layer 19 is provided between the fourth gate electrode layer 11d and the trench insulating layer 13.

The second block insulating layer 19 has a function of blocking a current flowing between the charge storage layer 16 and the gate electrode layer.

The second block insulating layer 19 is, for example, an oxide, an oxynitride, or a nitride. The second block insulating layer 19 contains, for example, aluminum (Al) and oxygen (O). The second block insulating layer 19 is, for example, an aluminum oxide. A thickness of the second block insulating layer 19 is, for example, equal to or more than 3 nm and equal to or less than 10 nm.

The second block insulating layer 19 is provided, and thus, the charge retention characteristics of the three-dimensional NAND flash memory are further improved as compared with the fourth embodiment.

As illustrated in FIG. 16, the second block insulating layer 19 includes a block region 19a and a first interlayer region 19b1. The block region 19a is provided between the first gate electrode layer 11a and the first block insulating layer 18. The first interlayer region 19b1 is provided between the first gate electrode layer 11a and the interlayer insulating layer 12.

The block region 19a contains aluminum (Al) and oxygen (O). The block region 19a contains or does not contain fluorine (F). The first interlayer region 19b1 contains aluminum (Al), oxygen (O), and fluorine (F). A fluorine concentration of the first interlayer region 19b1 is higher than a fluorine concentration of the block region 19a.

For example, fluorine is thermally diffused from the interlayer insulating layer 12 containing fluorine, and thus, the fluorine concentration of the first interlayer region 19b1 can be set to be higher than the fluorine concentration of the block region 19a.

As illustrated in FIG. 17, the second block insulating layer 19 includes a block region 19a and a second interlayer region 19b2. The block region 19a is provided between the first gate electrode layer 11a and the first block insulating layer 18. The second interlayer region 19b2 is provided between the first gate electrode layer 11a and the trench insulating layer 13.

The block region 19a contains aluminum (Al) and oxygen (O). The block region 19a contains or does not contain fluorine (F). The second interlayer region 19b2 contains aluminum (Al), oxygen (O), and fluorine (F). A fluorine concentration of the second interlayer region 19b2 is higher than a fluorine concentration of the block region 19a.

For example, fluorine is thermally diffused from the trench insulating layer 13 containing fluorine, and thus, the fluorine concentration of the second interlayer region 19b2 can be set to be higher than the fluorine concentration of the block region 19a.

Since the fluorine concentration of the first interlayer region 19b1 and the second interlayer region 19b2 are high, dielectric constants of the first interlayer region 19b1 and the second interlayer region 19b2 decrease. Accordingly, the capacity between the gate electrode layers is reduced. Thus, the power consumption of the three-dimensional NAND flash memory can be reduced. The speed of the three-dimensional NAND flash memory can be increased.

As described above, according to the fifth embodiment, it is possible to provide the semiconductor memory device capable of improving the charge retention characteristics as in the first and fourth embodiments.

In the first to fifth embodiments, although it has been described that the interlayer insulating layer 12 is provided between the word line WL or the gate electrode layer, the space between the word lines WL or the gate electrode layers may be, for example, a cavity.

The first block insulating layer 18 containing the same ferroelectric material as the material of the third embodiment can be applied to the semiconductor memory device according to the second embodiment, and the same effect as the effect of the third embodiment can be obtained. The first block insulating layer 18 containing the same ferroelectric material as the material of the third embodiment can also be applied to the semiconductor memory device according to the fourth and fifth embodiments, and the same effect as the effect of the third embodiment can be obtained. The ferroelectric region is provided in the first block insulating layer 18 between the trench insulating layer 13 and the second inter-cell region 16b2, and thus, the electrons trapped in the trap level of the second inter-cell region 16b2 are attracted to the ferroelectric region. Accordingly, the movement of the electrons in the second inter-cell region 16b2 is suppressed. Accordingly, the migration of the electrons is further suppressed, and the charge retention characteristics of the three-dimensional NAND flash memory are further improved.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked body in which a gate electrode layer and a first insulating layer are alternately stacked in a first direction;
a semiconductor layer provided in the stacked body and extending in the first direction;
a second insulating layer provided between the semiconductor layer and the stacked body;
a third insulating layer provided between the second insulating layer and the stacked body;
a first layer provided between the second insulating layer and the third insulating layer, the first layer containing silicon (Si) and nitrogen (N), the first layer including a first region between the gate electrode layer and the semiconductor layer and a second region between the first insulating layer and the semiconductor layer, the first region containing or not containing fluorine (F), the second region containing fluorine (F), and a fluorine concentration of the second region being higher than a fluorine concentration of the first region; and
a fourth insulating layer provided between the gate electrode layer and the third insulating layer and between the gate electrode layer and the first insulating layer, the fourth insulating layer including a third region between the gate electrode layer and the third insulating layer and a fourth region between the gate electrode layer and the first insulating layer, the third region containing or not containing fluorine (F), the fourth region containing fluorine (F), and a fluorine concentration of the fourth region being higher than a fluorine concentration of the third region.

2. The semiconductor memory device according to claim 1, wherein the fluorine concentration of the second region is equal to or less than $1 \times 10^{20}$ atoms/cm$^3$.

3. The semiconductor memory device according to claim 1, wherein an atomic ratio (N/Si) of nitrogen (N) to silicon (Si) in the first layer is equal to or more than 1.2.

4. The semiconductor memory device according to claim 1, wherein an atomic ratio (N/Si) of nitrogen (N) to silicon (Si) in the first region is larger than an atomic ratio (N/Si) of nitrogen (N) to silicon (Si) in the second region.

5. The semiconductor memory device according to claim 4, wherein the atomic ratio (N/Si) of nitrogen (N) to silicon (Si) in the first region is equal to or more than 1.25, and the atomic ratio (N/Si) of nitrogen (N) to silicon (Si) in the second region is equal to or more than 1.2 and less than 1.25.

6. The semiconductor memory device according to claim 1, wherein the first insulating layer contains fluorine.

7. The semiconductor memory device according to claim 1, wherein
the first insulating layer contains silicon (Si) and oxygen (O), and
the fourth insulating layer contains aluminum (Al) and oxygen (O).

8. The semiconductor memory device according to claim 1, wherein the third insulating layer contains a ferroelectric material at least in a region between the first insulating layer and the first layer.

9. The semiconductor memory device according to claim 8, wherein the third insulating layer contains a paraelectric material in a region between the gate electrode layer and the first layer.

10. A semiconductor memory device comprising:
a first gate electrode layer extending in a first direction;
a second gate electrode layer extending in the first direction and adjacent to the first gate electrode layer in a second direction crossing the first direction;
a semiconductor layer provided between the first gate electrode layer and the second gate electrode layer, and extending in a third direction crossing the first direction and the second direction;
a third gate electrode layer extending in the first direction and adjacent to the first gate electrode layer in the third direction;
a first insulating layer provided between the first gate electrode layer and the third gate electrode layer;
a second insulating layer provided between the semiconductor layer and the first gate electrode layer and between the semiconductor layer and the first insulating layer;
a third insulating layer provided between the second insulating layer and the first gate electrode layer and between the second insulating layer and the first insulating layer;
a first layer provided between the second insulating layer and the third insulating layer, the first layer containing silicon (Si) and nitrogen (N), the first layer including a first region between the first gate electrode layer and the semiconductor layer and a second region between the first insulating layer and the semiconductor layer, the first region containing or not containing fluorine (F), the second region containing fluorine (F), and a fluorine concentration of the second region being higher than a fluorine concentration of the first region; and
a fourth insulating layer provided between the first gate electrode layer and the third insulating layer and between the first gate electrode layer and the first insulating layer, the fourth insulating layer including a fifth region between the first gate electrode layer and the third insulating layer and a sixth region between the first gate electrode layer and the first insulating layer, the fifth region containing or not containing fluorine (F), and the sixth region containing fluorine (F), and a fluorine concentration of the sixth region being higher than a fluorine concentration of the fifth region.

11. The semiconductor memory device according to claim 10, wherein the fluorine concentration of the second region is equal to or less than $1\times10^{20}$ atoms/cm$^3$.

12. The semiconductor memory device according to claim 10, wherein an atomic ratio (N/Si) of nitrogen (N) to silicon (Si) in the first layer is equal to or more than 1.2.

13. The semiconductor memory device according to claim 10, wherein an atomic ratio (N/Si) of nitrogen (N) to silicon (Si) in the first region is larger than an atomic ratio (N/Si) of nitrogen (N) to silicon (Si) in the second region.

14. The semiconductor memory device according to claim 13, wherein the atomic ratio (N/Si) of nitrogen (N) to silicon (Si) in the first region is equal to or more than 1.25, and the atomic ratio (N/Si) of nitrogen (N) to silicon (Si) in the second region is equal to or more than 1.2 and less than 1.25.

15. The semiconductor memory device according to claim 10, wherein the first insulating layer contains fluorine.

16. The semiconductor memory device according to claim 10, wherein the first layer further includes a third region between the second gate electrode layer and the semiconductor layer and a fourth region between the first region and the third region, the third region contains or does not contain fluorine (F), the fourth region contains fluorine (F), and a fluorine concentration of the fourth region is higher than a fluorine concentration of the first region, and the fluorine concentration of the fourth region is higher than a fluorine concentration of the third region.

17. The semiconductor memory device according to claim 10, wherein the first insulating layer contains silicon (Si) and oxygen (O), and the fourth insulating layer contains aluminum (Al) and oxygen (O).

18. The semiconductor memory device according to claim 10, further comprising:

a fifth insulating layer provided between the first gate electrode layer and the second gate electrode layer, wherein the fourth insulating layer further includes a seventh region between the first gate electrode layer and the fifth insulating layer, the seventh region contains fluorine (F), and a fluorine concentration of the seventh region is higher than the fluorine concentration of the fifth region.

* * * * *